US011832415B2

(12) United States Patent
Breedy

(10) Patent No.: US 11,832,415 B2
(45) Date of Patent: Nov. 28, 2023

(54) POWER SUPPLY POWERLINE NETWORKING MANAGEMENT SYSTEM

(71) Applicant: Dell Products L.P., Round Rock, TX (US)

(72) Inventor: Andrew Breedy, Mitchelstown (IE)

(73) Assignee: Dell Products L.P., Round Rock, TX (US)

(*) Notice: Subject to any disclaimer, the term of this patent is extended or adjusted under 35 U.S.C. 154(b) by 184 days.

(21) Appl. No.: 17/158,427

(22) Filed: Jan. 26, 2021

(65) Prior Publication Data

US 2022/0046817 A1 Feb. 10, 2022

Related U.S. Application Data

(63) Continuation-in-part of application No. 16/985,309, filed on Aug. 5, 2020.

(51) Int. Cl.
*H05K 7/14* (2006.01)
*G06F 1/18* (2006.01)
*G06F 1/26* (2006.01)
*H04L 41/0226* (2022.01)

(52) U.S. Cl.
CPC ........... *H05K 7/1492* (2013.01); *G06F 1/189* (2013.01); *G06F 1/26* (2013.01); *H04L 41/0226* (2013.01)

(58) Field of Classification Search
CPC ....... G06F 1/26; G06F 1/189; H04L 41/0226; H05K 7/1492
USPC ........................................................ 700/295
See application file for complete search history.

(56) References Cited

U.S. PATENT DOCUMENTS

| 7,194,528 B1* | 3/2007 | Davidow | H04L 12/2836 340/310.17 |
| 8,674,823 B1* | 3/2014 | Contario | G01R 19/145 340/693.1 |
| 2004/0128562 A1* | 7/2004 | Bigelow | G06F 1/26 713/300 |
| 2017/0302462 A1* | 10/2017 | Yun | H04L 12/10 |
| 2017/0302508 A1* | 10/2017 | Kim | H04L 61/103 |
| 2018/0331854 A1* | 11/2018 | Nickel | H04L 12/10 |
| 2020/0221601 A1* | 7/2020 | Byers | H05K 7/20218 |

* cited by examiner

*Primary Examiner* — Mohamed A. Wasel
*Assistant Examiner* — John Fan
(74) *Attorney, Agent, or Firm* — Joseph Mencher

(57) ABSTRACT

A power supply powerline networking management system includes a chassis housing a power system coupled to a plurality of components and a management subsystem. A powerline networking engine in the power system receives first powerline management communications along with power via its first power connector, and converts the first powerline management communications to first dataline management communications. The powerline networking engine then transmits the first dataline management communications to the management subsystem via its data connector, and provides the power to the plurality of components via its second power connector. The data connector and the second power connector may be provided by a single, integrated connector structure, or by separate connector structures. The power system may also be configured to convert power, monitor and report the provisioning of power to the plurality of components, and activate a cooling system if the power system exceeds a temperature threshold.

20 Claims, 19 Drawing Sheets

POWER SUPPLY POWERLINE NETWORKING MANAGEMENT SYSTEM

CROSS-REFERENCE TO RELATED APPLICATIONS

The present disclosure is a Continuation-In-Part (CIP) of U.S. patent application Ser. No. 16/985,309, filed on Aug. 5, 2020, the disclosure of which is incorporated by reference herein in its entirety.

BACKGROUND

The present disclosure relates generally to information handling systems, and more particularly to managing information handling systems via powerline networking functionality in a power supply system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server computing devices and/or other computing devices known in the art, are sometimes provided in server racks that house and support multiple server computing devices. Furthermore, each of those server computing devices may include a dedicated management subsystem such as, for example, the integrated DELL® Remote Access Controller (iDRAC) available in server computing devices provided by DELL® Inc. of Round Rock, Texas, United States. In such systems, each server computing devices requires power cabling that connects that server computing device to a power distribution system in the server rack, with the power distribution system operating to distribute power from a power source to each of the server computing devices. Furthermore, each server devices also requires management network cabling that connects that server computing device to a management switch device (e.g., a dedicated management Top Of Rack (TOR) switch device) in the server rack, with that management switch device further coupled to a management network in order to allow for management of each of the server computing devices through the management network via their respective management subsystems. As will be appreciated by one of skill in the art in possession of the present disclosure, the need to provide separate power cabling and management network cabling for each server computing device in the server rack (as well a data network cabling between each server computing device and data switch device(s) in the server rack) results in a wide variety of cable routing issues, rack/server access issues, and/or other issues that arise from the relatively large number of cables required in the server rack.

Accordingly, it would be desirable to provide a network management system that addresses the issues discussed above.

SUMMARY

According to one embodiment, a power supply system includes a chassis; a data connector that is included on the chassis; a first power connector that is included on the chassis; a second power connector that is included on the chassis; a processing system that is housed in the chassis and coupled to the data connector, the first power connector, and the second power connector; a memory system that is housed in the chassis, that is coupled to the processing system, and that includes instructions that, when executed by the processing system, cause the processing system to provide a powerline networking engine that is configured to: receive, via the first power connector, first powerline management communications along with power; convert the first powerline management communications to first dataline management communications; transmit, to a management subsystem via the data connector, the first dataline management communications; and provide, to a plurality of components via the second power connector, the power.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
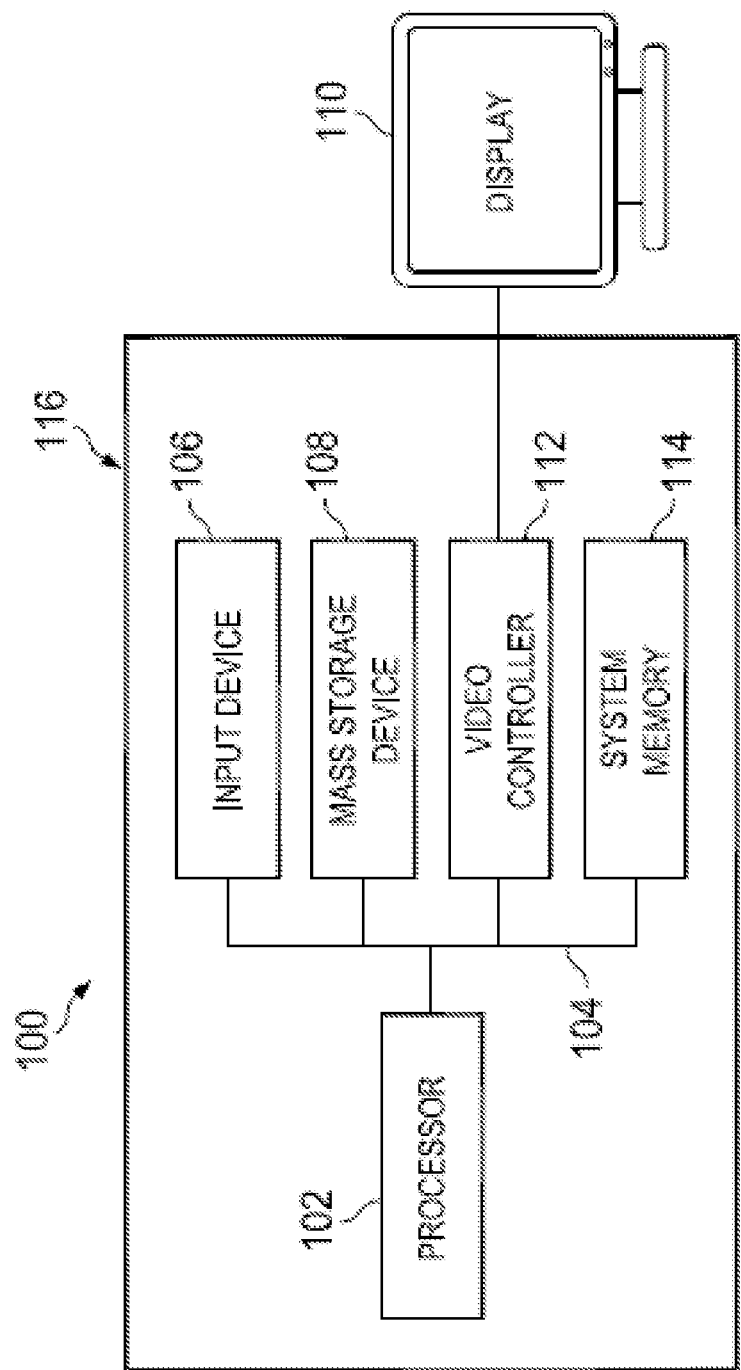
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
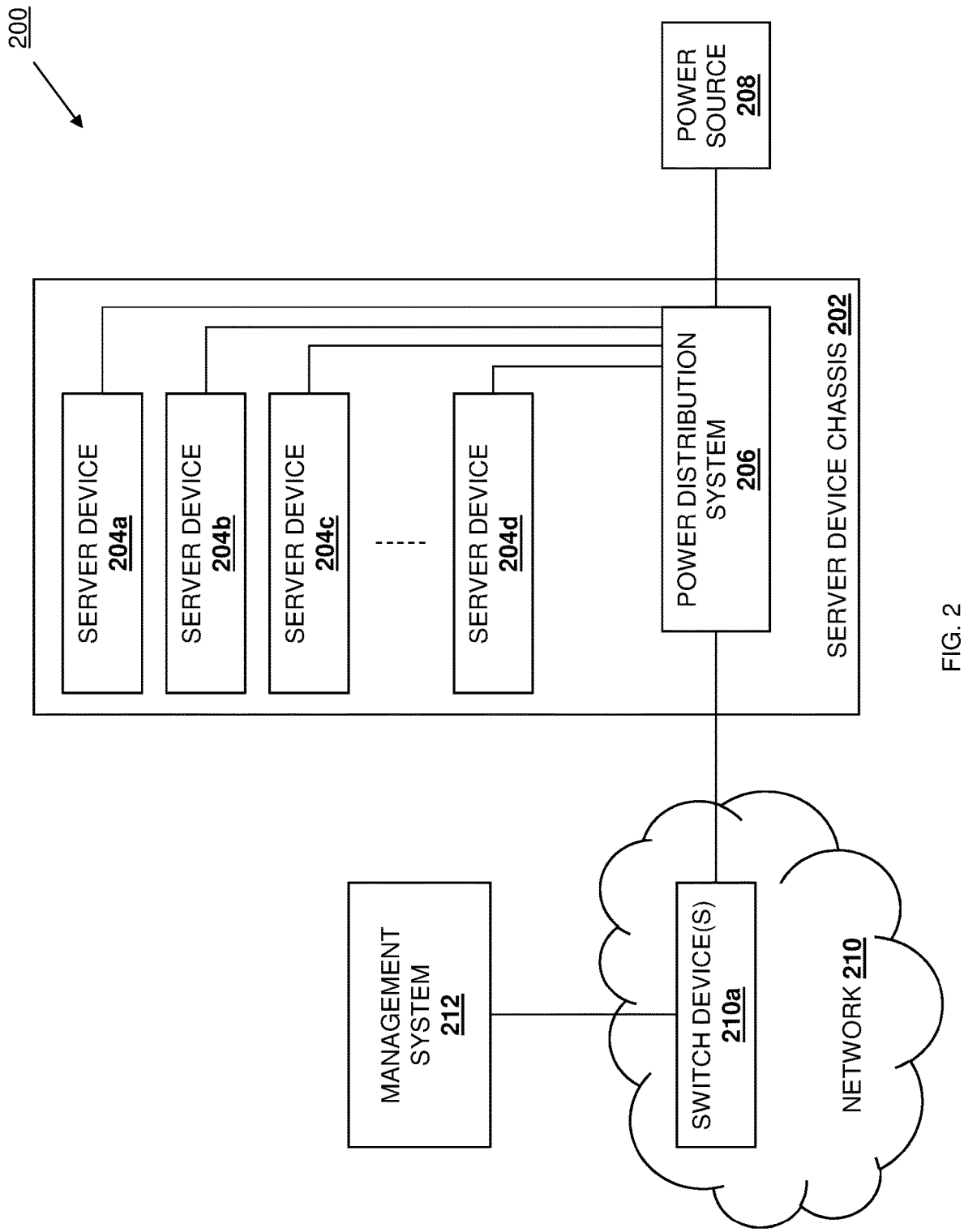
FIG. 2 is a schematic view illustrating an embodiment of a power distribution powerline networking management system.

Referring now to FIG. 2, an embodiment of a power distribution powerline networking management system 200 is illustrated. In the illustrated embodiment, the power distribution powerline networking management system 200 includes a device chassis that is illustrated in FIG. 2 as a server device chassis 202 that may be provided by a server rack and/or other device chassis known in the art. Furthermore, the device chassis may house a plurality of devices, with the server device chassis 202 housing a plurality of server devices 204a, 240b, 204c, and up to 204d. In an embodiment, any or all of the server devices 204a-204d may be provided by the IHS 100 discussed above with reference to FIG. 1, and/or may include some or all of the components of the IHS 100. However, while illustrated and discussed as being provided by server devices, one of skill in the art in possession of the present disclosure will recognize that devices provided in the device chassis included in the power distribution powerline networking management system 200 may include storage devices, storage controller devices, and/or any other devices that may be configured to operate similarly as the server devices 202a-202d discussed below.

In the illustrated embodiment, the server device chassis 202 also houses a power distribution system 206 that is coupled to each of the server devices 204a-204d. For example, in the embodiments discussed below, the power distribution system 206 is illustrated and described as a "power strip" that provides a plurality of Alternating Current (AC) power plug receptacle connectors that may connect to respective AC power plugs on respective AC power cabling that extends between each server device 204a-204d and the power distribution system 206. As such, each of the server devices 204a-204d may "plug into" the power distribution system 202 via conventional power cabling. However, while specific couplings between the server devices 204a-204d and the power distribution system 206 are illustrated and described herein, one of skill in the art in possession of the present disclosure will appreciate that other power couplings and/or power distribution systems will fall within the scope of the present disclosure as well.

As illustrated in FIG. 2, the power distribution system 206 may also be coupled to a power source 208. For example, AC power cabling may be provided between the power distribution system 206 and a wall outlet that provides the power source 208, and may operate to provide power to the power distribution system 206 so that the power distribution system 206 may provide that power to the server devices 204a-204d as discussed below. However, while a specific power source is described, one of skill in the art in possession of the present disclosure will recognize that a variety of power sources will fall within the scope of the present disclosure as well. As also illustrated in FIG. 2, the power distribution system 206 is also coupled to one or more switch devices 210a that provide a network 210. For example, as discussed below, a data coupling such as Ethernet cabling may be provided between the power distribution system 206 and a core switch device that is included in the switch device(s) 210a that provide the network 210. However, while a specific connection between the power distribution system 206 and the switch device(s) 210a is described, one of skill in the art in possession of the present disclosure will recognize that a variety of couplings will fall within the scope of the present disclosure as well.

As illustrated in FIG. 2, a management system 212 may be coupled to one of the switch device(s) 210a that provide the network 210, and may be provided by the IHS 100 discussed above with reference to FIG. 1, and/or may include some or all of the components of the IHS 100, and in specific examples may be provided by one or more management server devices that are configured to perform management operations for the server devices 204a-204d. However, while illustrated and discussed as being provided by management server devices, one of skill in the art in possession of the present disclosure will recognize that the management system 212 may be provided by a variety of other devices that may be configured to operate similarly as the management system 212 discussed below. Furthermore, while a specific power distribution powerline networking management system 200 has been illustrated and described, one of skill in the art in possession of the present disclosure will recognize that the power distribution powerline networking management system of the present disclosure may include a variety of components and component configurations while remaining within the scope of the present disclosure as well.

Figure 3A:
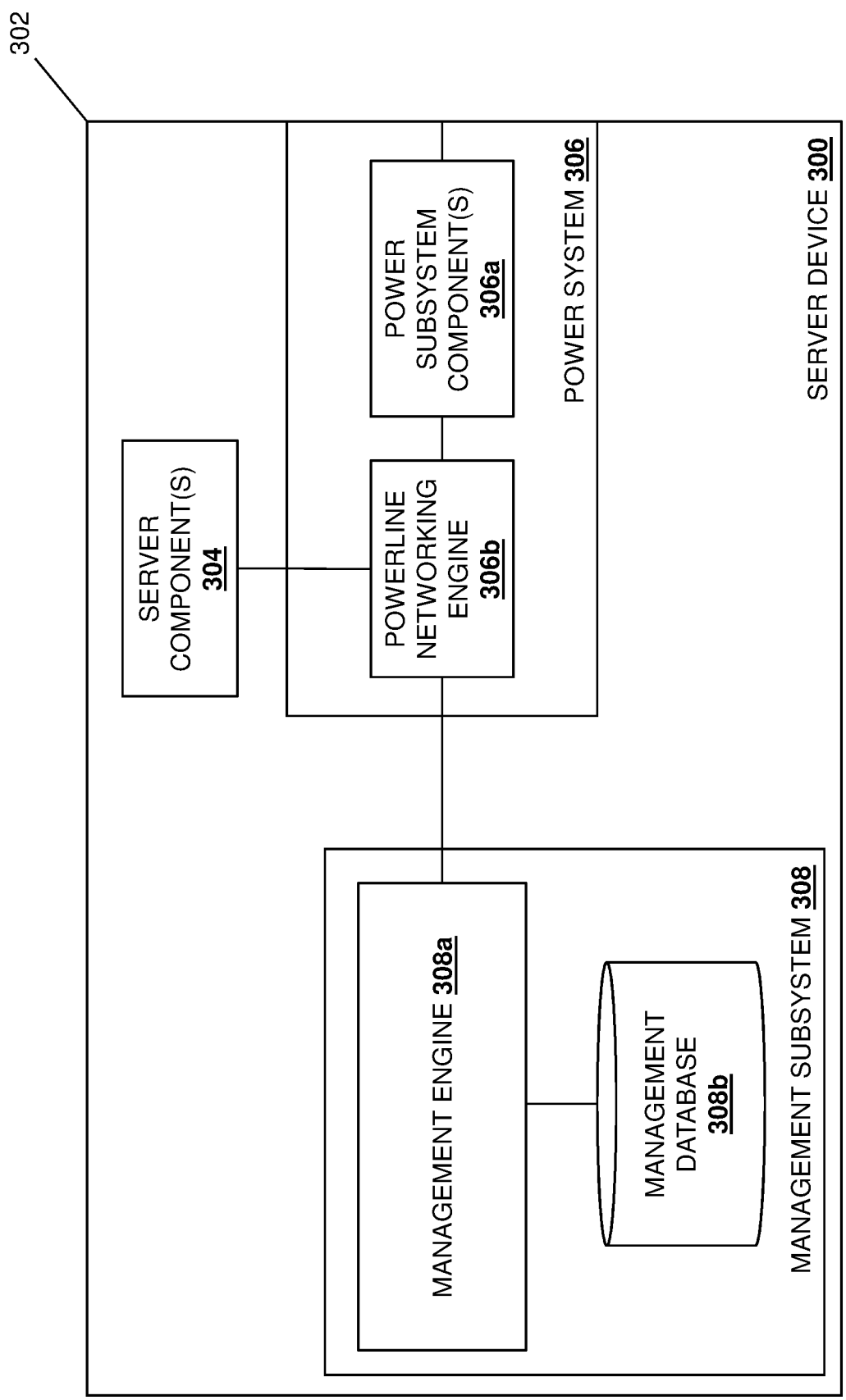
FIG. 3A is a schematic view illustrating an embodiment of a server device that may be provided in the power distribution powerline networking management system of FIG. 2 and that may include the power supply powerline networking management system of the present disclosure.

Referring now to FIG. 3A, an embodiment of a server device 300 is illustrated that may provide any or all of the server devices 204a-204d discussed above with reference to FIG. 2. As such, the server device 300 may be provided by the IHS 100 discussed above with reference to FIG. 1 and/or may include some or all of the components of the IHS 100. However, while illustrated and discussed as being provided by a server device, one of skill in the art in possession of the present disclosure will recognize that the functionality of the server device 300 discussed below may be provided by storage controller devices and/or other devices that are configured to operate similarly as the server device 300 discussed below. In the illustrated embodiment, the server device 300 includes a chassis 302 that houses the components of the server device 300, only some of which are illustrated and discussed below. For example, the chassis 302 may house one or more server components 304 such as, for example, a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to perform any of a variety of server functionality that would be apparent to one of skill in the art in possession of the present disclosure.

Figure 3B:
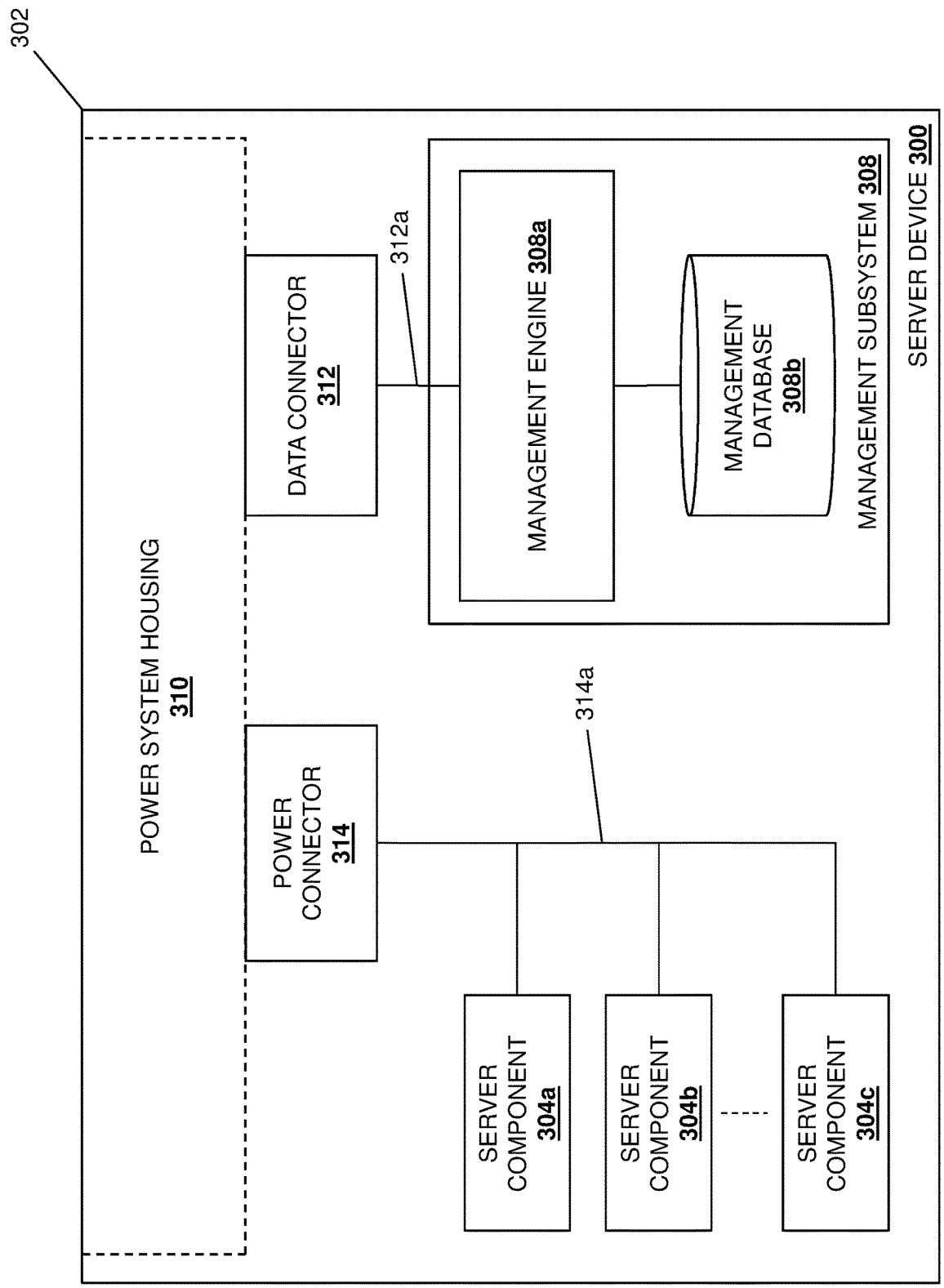
FIG. 3B is a schematic view illustrating an embodiment of the server device of FIG. 3A.
Figure 3C:
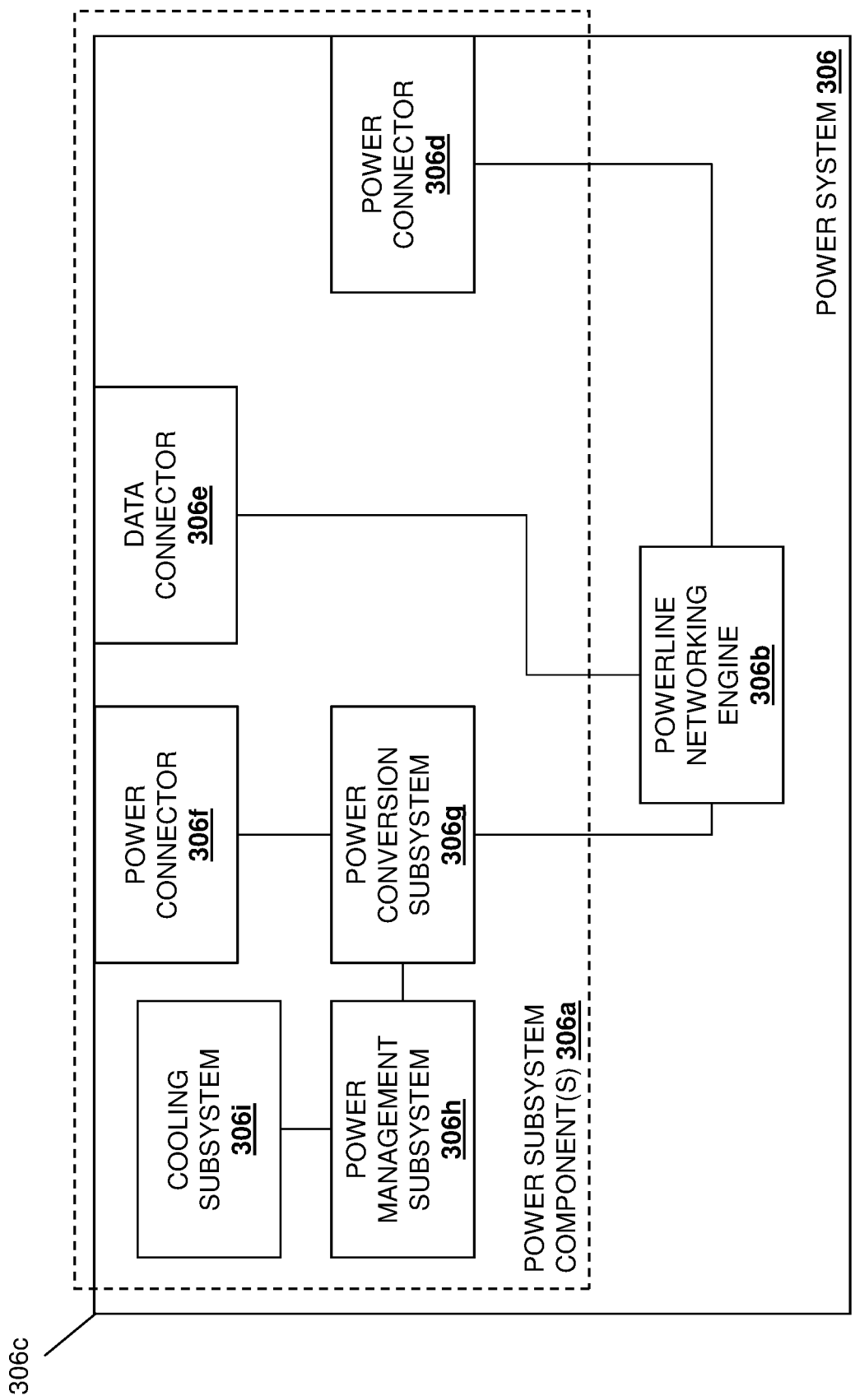
FIG. 3C is a schematic view illustrating an embodiment of a power system that may be provided in the server device of FIGS. 3A and 3B.

As illustrated in FIG. 3, the chassis 302 may also house a power system 306 such as, for example, one or more Power Supply Units (PSUs) and/or any other power system that would be apparent to one of skill in the art in possession of the present disclosure. In the illustrated embodiment, the power system 306 includes one or more power subsystem components 306a that, as discussed below with reference to FIG. 3C, may include a power system connector that is configured to connect the power system 306 in the server device 300 to the power distribution system 206 discussed above with reference to FIG. 2 (e.g., via the AC power cabling discussed above), power conversion components that are configured to convert power received from the power distribution system 206, and/or any other power subsystem components that would be apparent to one of skill in the art in possession of the present disclosure.

Furthermore, the power system 306 may also include a powerline networking processing system (not illustrated, but which may include the processor 102 discussed above with reference to FIG. 1) and a powerline networking memory system (not illustrated, but which may include the memory 114 discussed above with reference to FIG. 1) that is coupled to the powerline networking processing system and that includes instructions that, when executed by the powerline networking processing system, cause the powerline networking processing system to provide a powerline networking engine 306b that is coupled to the power subsystem component(s) 306a in order to perform the functionality of the server powerline networking engines and/or server devices discussed below. In a specific example, the powerline networking engine 306a may be provided on a circuit board that is included in the PSU provided in the server device 300, although one of skill in the art in possession of the present disclosure will recognize that other powerline networking engine configurations will fall within the scope of the present disclosure as well.

In the illustrated embodiment, the chassis 302 also houses a management subsystem 308 that is coupled to the powerline networking engine 306b in the power system 306, and that may be provided by, for example, a remote access controller system such as the integrated DELL® Remote Access Controller (iDRAC) available from the DELL® Inc. of Round Rock, Texas, United States, a Baseboard Management Controller (BMC), a storage array management controller, and/or other management subsystems known in the art. For example, the management subsystem 308 may include a management processing system (not illustrated, but which may include the processor 102 discussed above with reference to FIG. 1) and a management memory system (not illustrated, but which may include the memory 114 discussed above with reference to FIG. 1) that is coupled to the management processing system and that includes instructions that, when executed by the management processing system, cause the management processing system to provide a management engine 308a that is coupled to the powerline networking engine 306b in the power system 306, and that is configured to perform the functionality of the management engines and/or management subsystems discussed below.

Furthermore, the management subsystem 308 may also include a storage system (not illustrated, but which may be provided by the storage device 108 discussed above with reference to FIG. 1) that provides a management database 308b that is coupled to the management engine 308a (e.g., via a coupling between the management processing system and the storage system) and that is configured to store any information utilized by the management engine 308a. However, while a specific server device 300 has been illustrated, one of skill in the art in possession of the present disclosure will recognize that server devices (or other devices operating according to the teachings of the present disclosure in a manner similar to that described below for the server device 300) may include a variety of components and/or component configurations for providing conventional server device functionality, as well as the functionality discussed below, while remaining within the scope of the present disclosure as well.

With reference to FIG. 3B, an embodiment of the server device 300 discussed above with reference to FIG. 3A is illustrated, with similar elements provided with similar reference numbers. As such, the chassis 302 of the server device 300 is illustrated as housing the management subsystem 308 (which includes the management engine 308a and the management database 308b discussed above), as well as the server component(s) 304 that are illustrated in FIG. 3B by a server component 304a, a server component 304b, and up to a server component 304c. In the illustrated embodiment, the chassis 302 defines a power system housing 310 that may be provided by, for example, a PSU housing and/or other power system housing known in the art. Furthermore, while not specifically illustrated in FIG. 3B, one of skill in the art in possession of the present disclosure will recognize how the chassis 302/power system housing 310 may include power system couplings and/or securing subsystems (e.g., PSU coupling and/or securing subsystems) that are configured to allow the power system 306 discussed above to be positioned in, coupled to, and secured in the power system housing 310 defined by the chassis 302. Furthermore, one of skill in the art in possession of the present disclosure will appreciate that the server device 300 may utilize more than one power system (e.g., multiple PSUs), and thus the power system housing 310 illustrated in FIG. 3B may provide an example of one of multiple power system housings (for housing respective PSUs utilized by the server device 300) that may be included in the chassis 302.

In the illustrated embodiment, the chassis 302 houses a data connector 312 that is located adjacent the power system housing 310, and that is coupled to the management subsystem via one or more data couplings 312a (e.g., cabling, board traces, and/or other couplings that one of skill in the art in possession of the present disclosure will recognize as being capable of transmitting the dataline management communications discussed below). Furthermore, the chassis 302 also houses a power connector 314 that is located adjacent the power system housing 310, and that is coupled to the server components 304a, 304b, and up to 304c via power couplings 314a (e.g., cabling, board traces, and/or other couplings that one of skill in the art in possession of the present disclosure will recognize as being capable of transmitting the power discussed below). One of skill in the art in possession of the present disclosure will appreciate how the power couplings 314a may configure a power system (e.g., the power system 306 discussed above) positioned in the power system housing 310 to distribute power to the server components 304a, 304b, and up to 304c. Furthermore, in some embodiments in which the server device 300 utilizes multiple power systems (e.g., multiple PSUs), respective data connector/power connector groups (e.g., similar to the data connector 314/power connector 314 group illustrated in FIG. 3B) may be located adjacent each respective power system housing (or some subset of the power systems housings in the chassis 302). However, in other embodiments in which the server device 300 utilizes multiple power systems (e.g., multiple PSUs), a data connector/power connector group (e.g., like the data connector 314/power connector 314 group illustrated in FIG. 3B) may be located adjacent only one of the power system housings.

In some embodiments, the data connector 312 and power connector 314 located adjacent the power system housing 310 may be integrated as part of a single connector structure. For example, a conventional PSU power connector structure (e.g., that includes the power connector 314) may be modified to include the data connector 312 and provide a single combined power/data connector structure, which as discussed below may allow for coupling to the power system 306 (i.e., with a corresponding combined power/data connector, discussed below) via a single connector/connection. In other embodiments, the data connector 312 and power connector 314 may be provided by separate connector structures in the chassis 302. For example, the power connector 314 may be provided by a conventional PSU power connector structure, while the data connector 312 may be provided by a variety of data connector structures (e.g., an Ethernet connector structure, a Fibre Channel connector structure, etc.) known in the art and added to the chassis 302 adjacent the power system housing 310 and power connector 314, which as discussed below may allow for coupling to the power system 306 (i.e., with corresponding separate power and data connectors, discussed below) via respective connectors/connections. In another embodiment, the data connector 312 may be provided by an Ethernet connector that is located on the management subsystem 308, although one of skill in the art in possession of the present disclosure will recognize that a variety of other data connectors will fall within the scope of the present disclosure as well.

With reference to FIG. 3C, an embodiment of the power system 306 discussed above with reference to FIG. 3A is illustrated, with similar elements provided with similar reference numbers. As such, the power system 306 is illustrated as including the power subsystem component(s) 306a and the powerline networking engine 306b. Furthermore, FIG. 3C illustrates how the power system 306 may include a chassis 306c (e.g., a PSU chassis) that houses the power subsystem component(s) 306a (e.g., PSU components) that may include a power connector 306d that is coupled to the powerline networking engine 306b (e.g., via a coupling between the power connector 306d and the powerline networking processing system) and configured to connect to the power distribution system 206, a data connector 306e that is coupled to the powerline networking engine 306b (e.g., via a coupling between the data connector 306e and the powerline networking processing system) and configured to connect to the data connector 312, a power connector 306f that is configured to connect to the power connector 314, a power conversion subsystem 306g (e.g., an Alternating Current/Direct Current (AC/DC) power conversion subsystem and/or other power conversion subsystem known in the art) that is coupled to the power connector 306f and the powerline networking engine 306b (e.g., via a coupling between the power conversion subsystem 306g and the powerline networking processing system), a power management subsystem 306h that is coupled to the power conversion subsystem 306g, and a cooling subsystem 306i (e.g., one or more fan devices and/or other cooling subsystems known in the art) that is coupled to the power management subsystem 306h. However, while specific power subsystem components and component configurations/connections are illustrated, one of skill in the art in possession of the present disclosure will recognize that different components and/or configurations/connections will fall within the scope of the present disclosure as well.

In some embodiments, the data connector 306e and power connector 306f may be integrated as part of a single connector structure. For example, a conventional PSU power connector structure (e.g., that includes the power connector 306f) may be modified to include the data connector 306e and provide a single combined power/data connector structure, which one of skill in the art in possession of the present disclosure will recognize may allow for coupling of the power system 306 to a corresponding single combined power/data connector structure on the server device 300 provided by the power connector 314 and the data connector 312. In other embodiments, the data connector 306e and power connector 306f may be provided by separate connector structures in the chassis 306c. For example, the power connector 306f may be provided by a conventional PSU power connector structure, while the data connector 308e may be provided by a variety of data connector structures known in the art and added to the chassis 306c adjacent the power connector 306f such that it is externally accessible on the chassis 306c, which one of skill in the art in possession of the present disclosure will recognize may allow for coupling of the power system 306 to respective power and data connectors on the server device 300 provided by the power connector 314 and the data connector 312.

In a specific example, the data connector 306e may be provided by an Ethernet connector that is externally accessible on the chassis 306c, which allows the power system 306 to be positioned in the power system housing 310, the power connectors 306f and 314 to be connected in a variety of conventional manners (e.g., by a power cable, in response to the positioning of the power system 306 in the power system housing 310, etc.), and the data connector 306e/Ethernet connector on the power system 306 to be connected to the data connector 312/Ethernet connector on the management subsystem 308 by an Ethernet cable. However, while several examples of the power/data couplings between the power system 306 and the server device 300 are provided, one of skill in the art in possession of the present disclosure will recognize that a variety of other power and data connections may be provided between the power system 306 and the server device 300 while remaining within the scope of the present disclosure as well.

Figure 4:
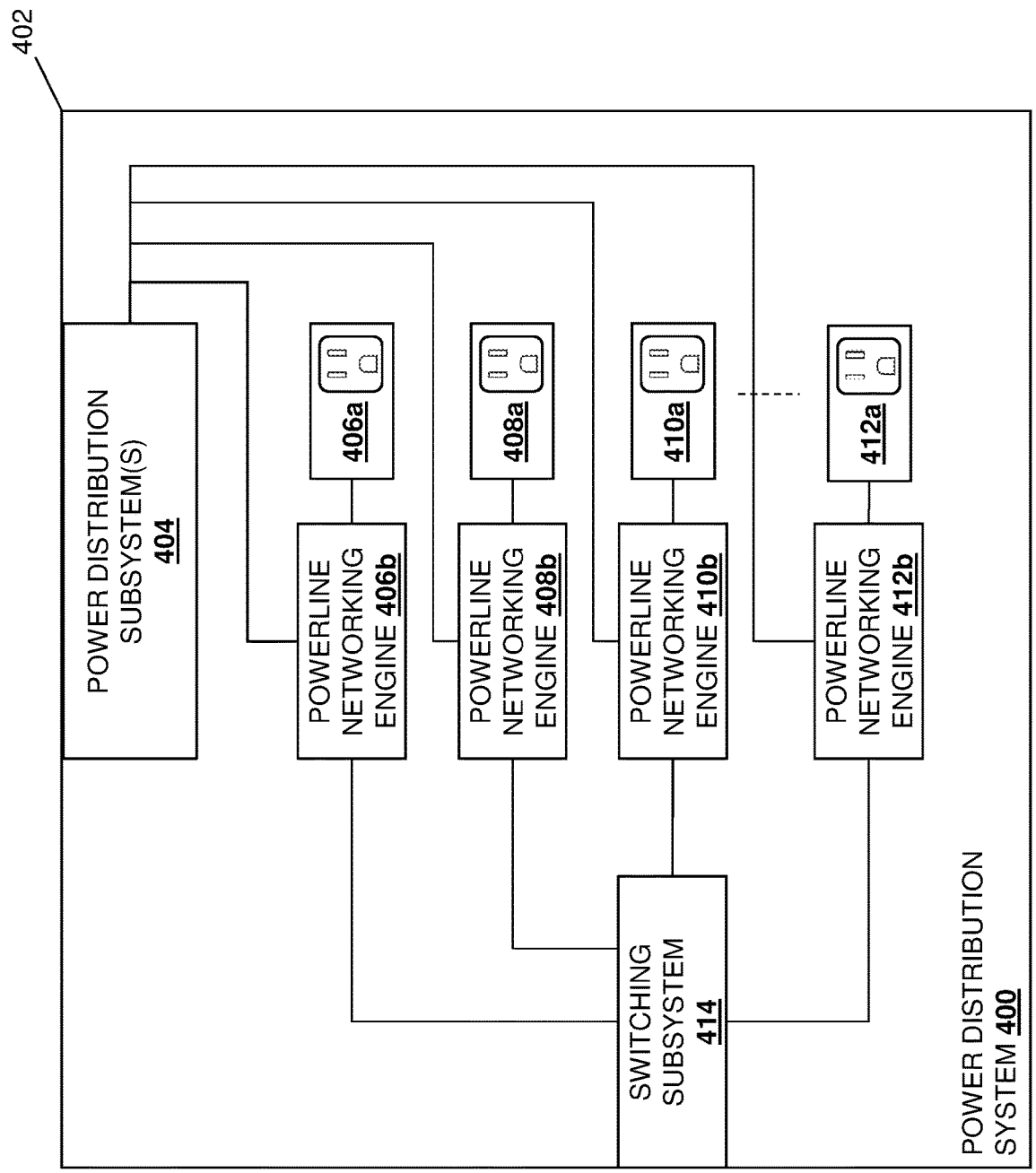
FIG. 4 is a schematic view illustrating an embodiment of a power distribution system that may be provided in the power distribution powerline networking management system of FIG. 2.

Referring now to FIG. 4, an embodiment of a power distribution system 400 is illustrated that may provide the power distribution system 206 discussed above with reference to FIG. 2. As such, the power distribution system 400 may be provided by a Power Distribution Unit (PDU) and/or using a variety of power distribution components known in the art. In the illustrated embodiment, the power distribution system 400 includes a chassis 402 that houses the components of the power distribution system 400, only some of which are illustrated below. For example, the chassis 402 may house one or more power distribution components 404 that one of skill in the art in possession of the present disclosure would recognize as allowing the power distribution system 400 to receive power from the power source 208, and/or perform any of the power distribution functionality discussed below. Furthermore, as illustrated in FIG. 4, the chassis 402 also houses a plurality of power connectors 406a, 408a, 410a, and up to 412a. One of skill in the art in possession of the present disclosure will recognize that the power connectors 406a, 408a, 410a, and up to 412a are illustrated and described as being provided by AC plug receptacles, but may be provided by other power connectors and/or couplings while remaining within the scope of the present disclosure as well.

In the illustrated embodiment, a respective powerline networking engine 406b, 408b, 410b, and up to 412b is provided with each power connector 406a, 408a, 410a, and up to 412a, respectively, and each powerline networking engine 406b, 408b, 410b, and up to 412b may be coupled to the power distribution subsystem(s) 404 as well. In an embodiment, each of the powerline networking engine 406b, 408b, 410b, and up to 412b may be provided by a powerline networking processing system (not illustrated, but which may include the processor 102 discussed above with reference to FIG. 1) and a powerline networking memory system (not illustrated, but which may include the memory 114 discussed above with reference to FIG. 1) that is coupled to the powerline networking processing system and that includes instructions that, when executed by the powerline networking processing system, cause the powerline networking processing system to provide that powerline networking engine that is configured to perform the functionality of the power distribution powerline networking engines and/or power distribution systems discussed below. In a specific example, each powerline networking engine 406b, 408b, 410b, and up to 412b may be provided on a circuit board that is connected to the power connector 406a, 408a, 410a, and up to 412a, respectively, although one of skill in the art in possession of the present disclosure will recognize that other powerline networking engine configurations will fall within the scope of the present disclosure as well. For example, in some embodiments, a powerline networking engine may be provided for multiple power connectors (e.g., a powerline networking engine may be provided for more than two, and up to all, of the power connectors 406a, 408a, 410a, and up to 412a.

In the illustrated embodiment, the chassis 402 also houses a switching subsystem 414 that is coupled to each of the powerline networking engines 406b, 408b, 410b, and up to 412b via, for example, traces on one or more circuit boards, cabling, and/or other coupling techniques known in the art. In a specific example, the switching subsystem 414 may be provided by an Ethernet management switch that is integrated in the chassis 402 of the power distribution system 400, but one of skill in the art in possession of the present disclosure will recognize that the functionality discussed below as being provided by the switching subsystem 414 may be provided by a variety of devices and/or subsystems while remaining within the scope of the present disclosure as well. However, while a specific power distribution system 400 has been illustrated, one of skill in the art in possession of the present disclosure will recognize that power distribution systems (or other devices operating according to the teachings of the present disclosure in a manner similar to that described below for the power distribution system 400) may include a variety of components and/or component configurations for providing conventional power distribution functionality, as well as the functionality discussed below, while remaining within the scope of the present disclosure as well.

Figure 5:
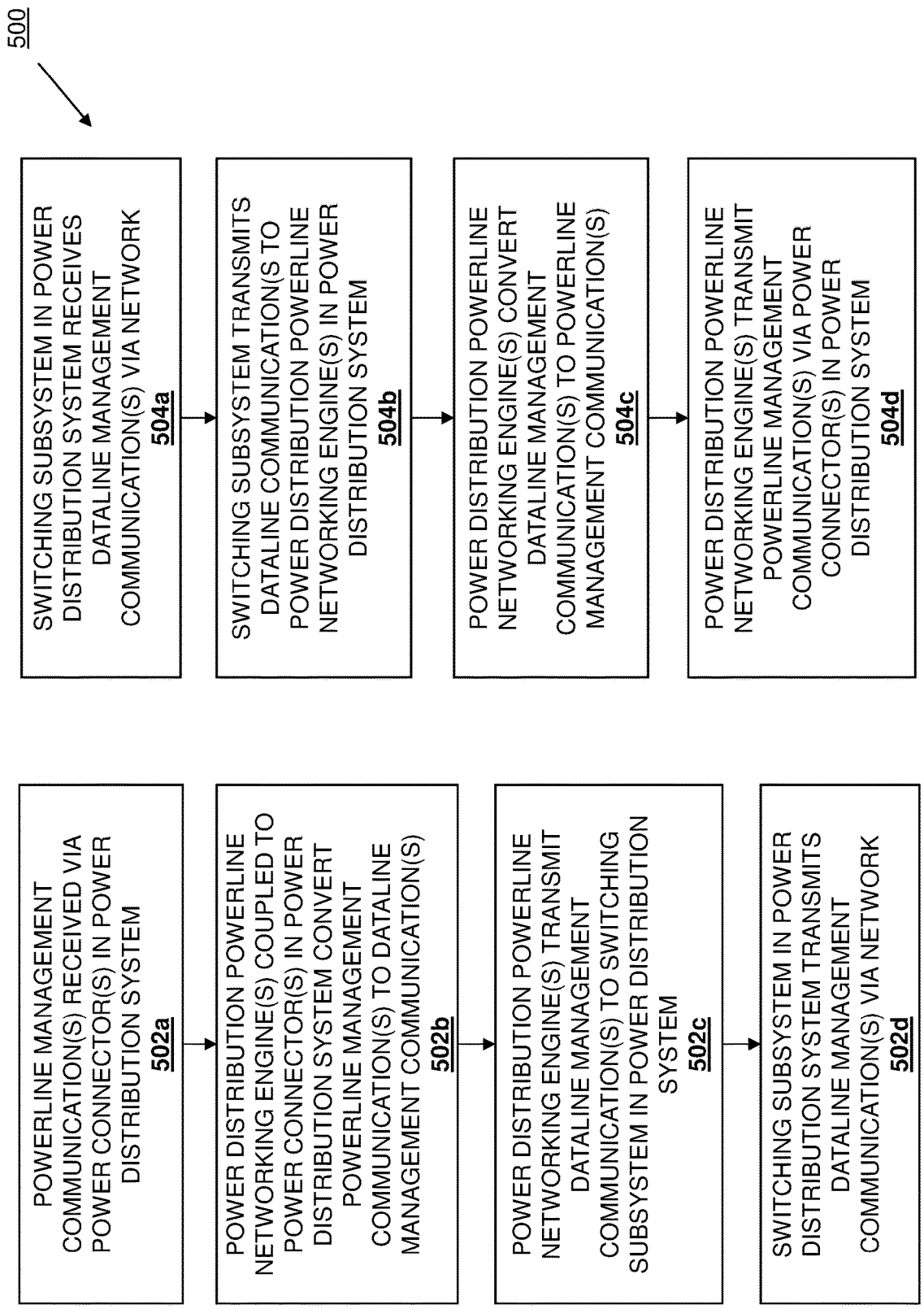
FIG. 5 is a flow chart illustrating an embodiment of a method for power supply powerline networking management.

Referring now to FIG. 5, an embodiment of a method 500 for power supply powerline networking management is illustrated. As discussed below, the systems and methods of the present disclosure provide a power supply system that includes a powerline networking engine that operates to convert between dataline management communications and powerline management communications, which allows the management subsystem in a server device that includes that power supply system to perform management operations via the power cabling connected to the power supply system. For example, embodiments of the power supply powerline networking management system of the present disclosure may include a chassis housing a power system coupled to a plurality of components and a management subsystem. A powerline networking engine in the power system receives first powerline management communications along with power via its first power connector, and converts the first powerline management communications to first dataline management communications. The powerline networking engine then transmits the first dataline management communications to the management subsystem via its data connector, and provides the power to the plurality of components via its second power connector. The data connector and the second power connector may be provided by a single, integrated connector structure, or by separate connector structures. The power system may also be configured to convert power, monitor and report the provisioning of power to the plurality of components, and activate a cooling system if the power system exceeds a temperature threshold. As such, management communications associated with management subsystems in server devices may be converted by the power supply system between dataline management communications and powerline management communications in order to allow their transmission via power cabling, thus eliminating the need for management network cabling for each of the server devices in order to enable the performance of management operations.

As discussed below, the method 500 allows the for transmission of management communications from any of the server devices 204a-204d to the management system 212, and from the management system 212a to any of the server devices 204a-204d, and those management communication transmission may be provided at the same time. As such, the method 500 is described below as including blocks 502a-502d that describe the transmission of management communications from the server device 204a to the management system 212, and well as including blocks 504a-504d that describe the transmission of management communications from the management system 212 to the server device 204a, and one of skill in the art in possession of the present disclosure will recognize how the blocks 502a-502d and 504a-504d may be performed at the same (or different) times while remaining within the scope of the present disclosure Furthermore, the discussion of the transmission of management communications below focuses on the server device 204a, but one of skill in the art in possession of the present disclosure will appreciate that management communications may be transmitted between the management system 212 and any of the server devices 204b-204d while remaining within the scope of the present disclosure as well. The inventor of the present disclosure described techniques that may be utilized in the power distribution powerline networking management system of the present disclosure for remote server management using a power line network in U.S. patent application Ser. No. 16/867,550, filed on May 5, 2020, the disclosure of which is incorporated herein by reference in its entirety.

As such, in some embodiments, the method 500 may begin at block 502a where powerline management communication(s) are received via power connector(s) in a power distribution system. As will be appreciated by one of skill in the art in possession of the present disclosure, the management subsystem 308 in the server device 204a/300 may operate during the method 500 to generate management communications associated with the management of the server device 204a. For example, the management subsystem 308 may be provided by an iDRAC® in a server device provided by DELL® Inc. of Round Rock, Texas, United States, and may be configured to generate and transmit management communications that provide for the management of that server device via a network, and one of skill in the art in possession of the present disclosure will recognize that any of a variety of management communications known in the art may be generated at block 502a. In embodiments in which the server device 300 utilizes multiple power systems (e.g., multiple PSUs), during or prior to the method 500 the management engine 308a may select one of those power systems (e.g., the power system 306 positioned in the power system housing 310 discussed above) for use in the management communications discussed below.

Figure 6A:
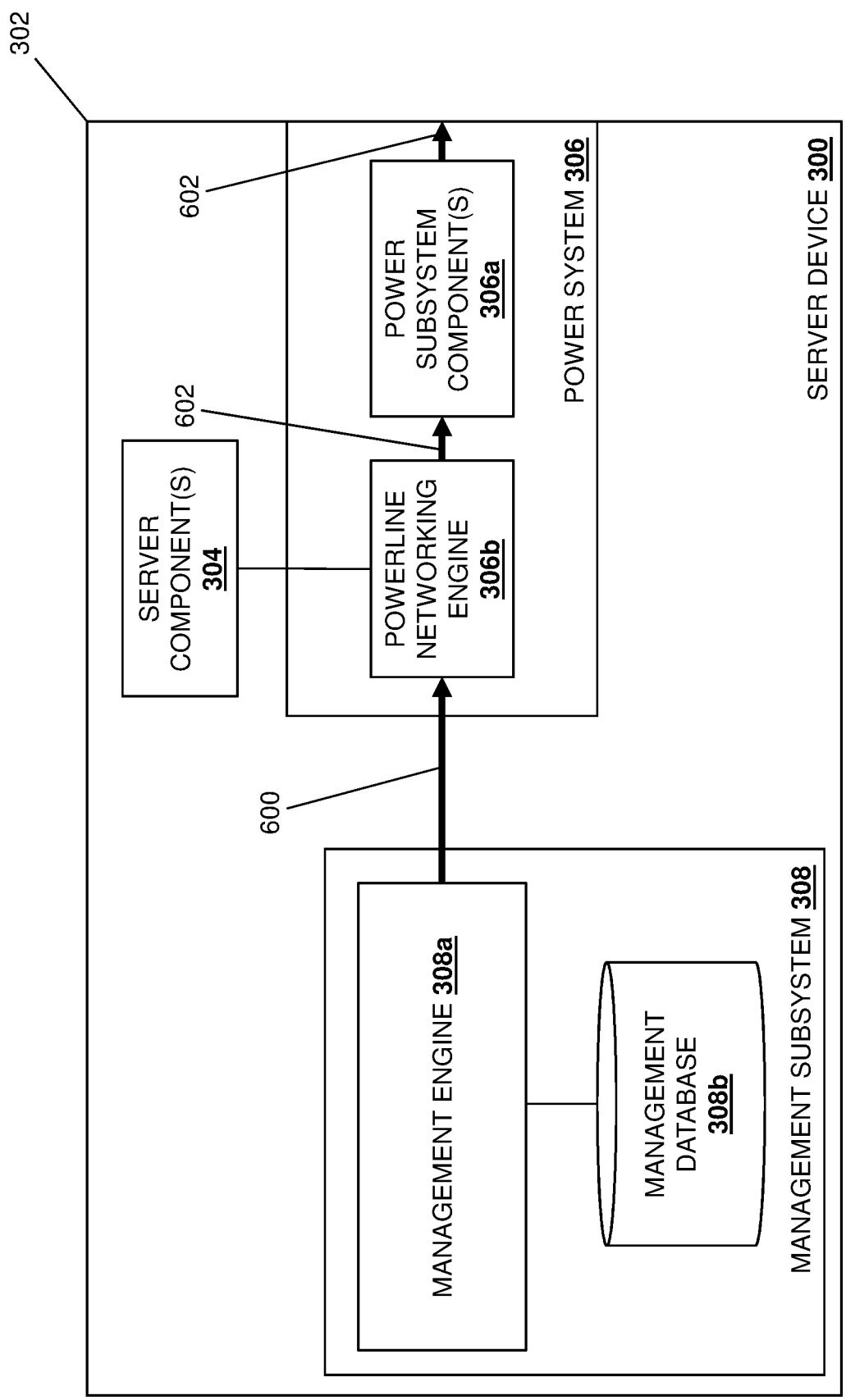
FIG. 6A is a schematic view illustrating an embodiment of the server device of FIG. 3A operating during the method of FIG. 5.
Figure 6B:
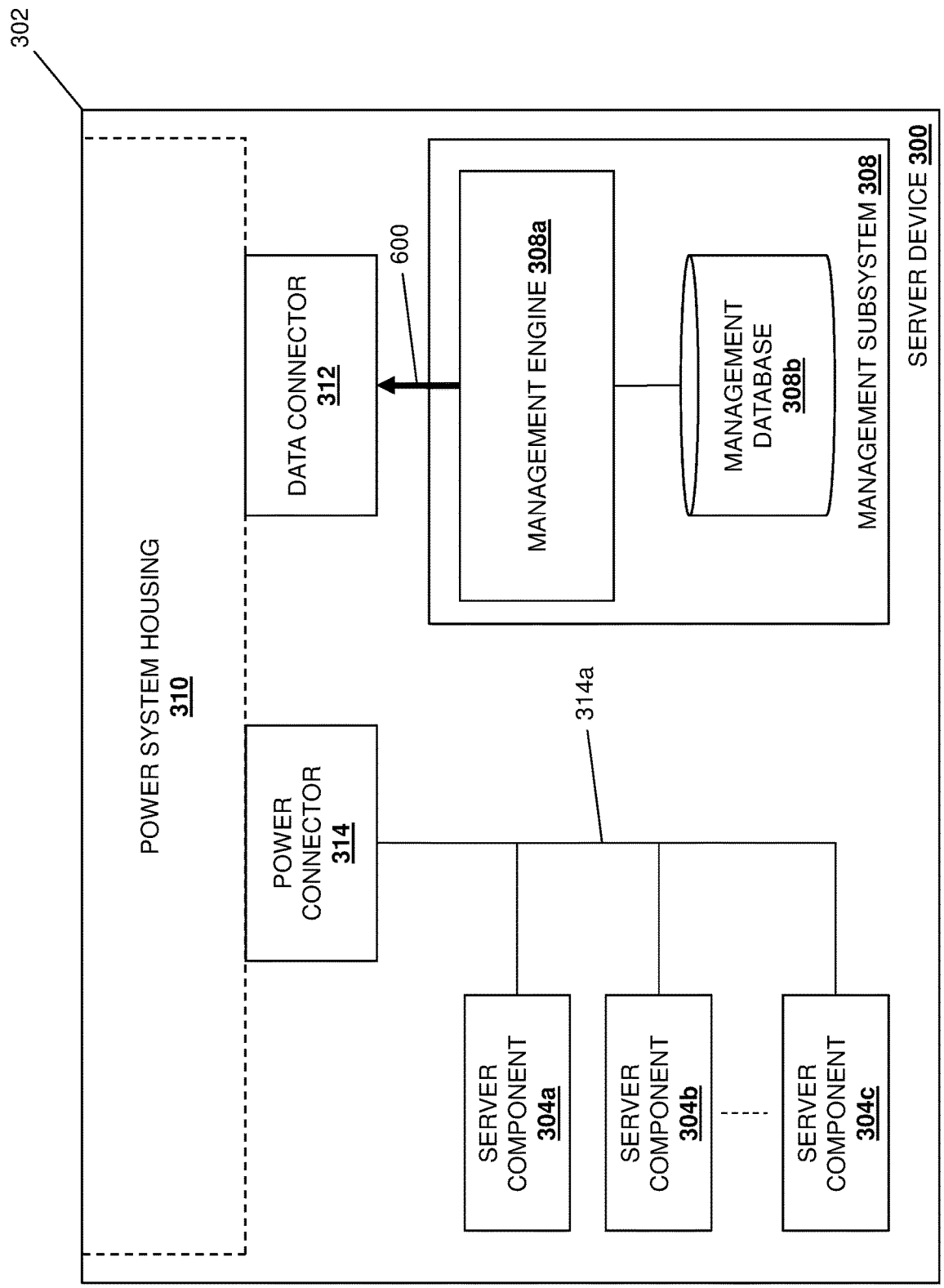
FIG. 6B is a schematic view illustrating an embodiment of the server device of FIG. 3B operating during the method of FIG. 5.
Figure 6C:
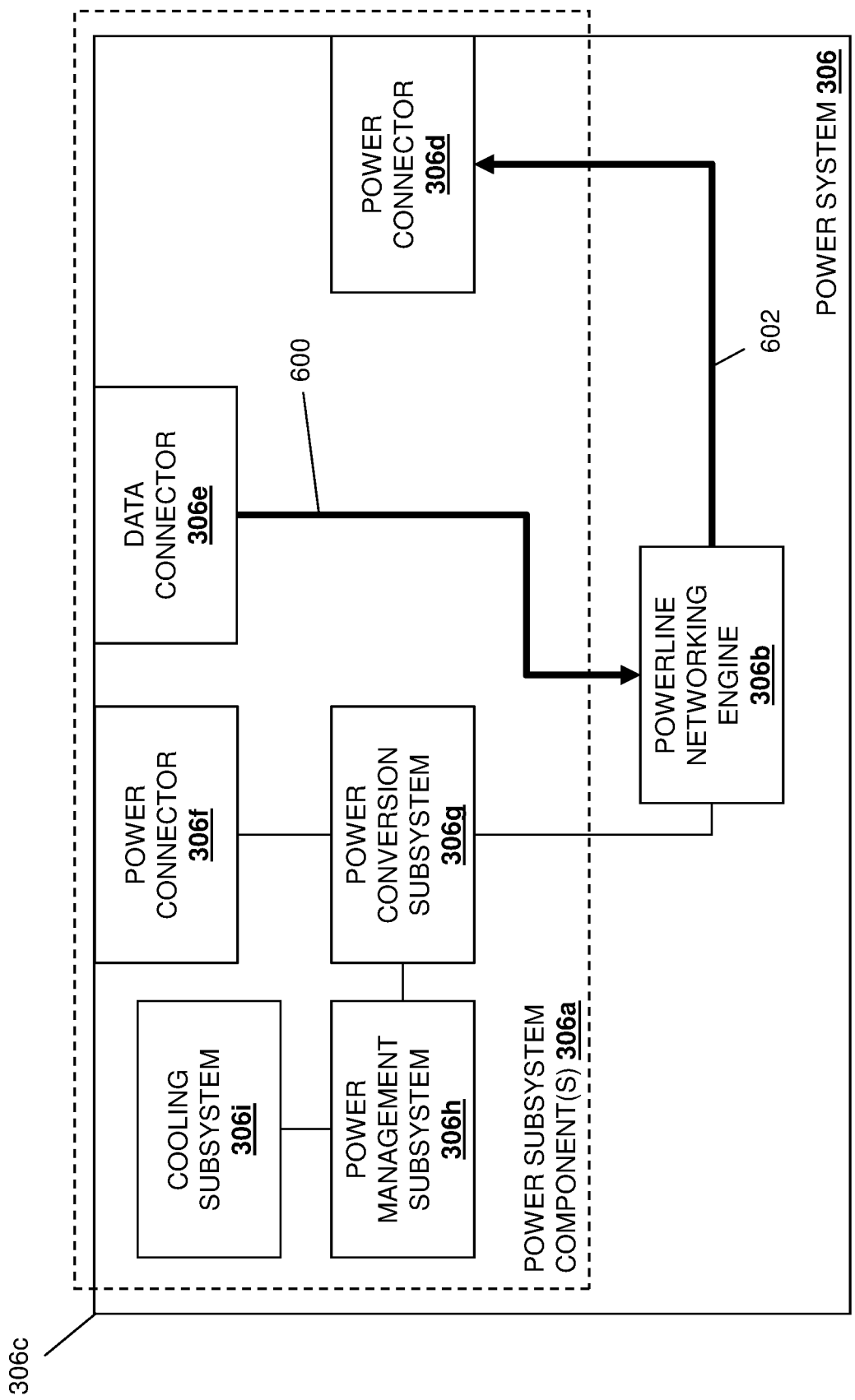
FIG. 6C is a schematic view illustrating an embodiment of the power system of FIG. 3C operating during the method of FIG. 5.

With reference to FIGS. 6A, 6B, and 6C, in an embodiment of block 502a, the management engine 308a in the management subsystem 308 included in the server device 204a/300 may then perform dataline management communication transmission operations 600 that operate to transmit dataline management communication from the management engine 308a, via the data couplings 312a, through the data connectors 312 and 306e, and to the powerline networking engine 306b in the power system 306 (which is positioned in the power system housing 310 in the server device 204a/300). As will be appreciated by one of skill in the art in possession of the present disclosure, the dataline management communications generated and transmitted at block 502a may include Ethernet management communications, Fiber Channel management communications, iSCSI management communication, and/or management communications transmitted via any of a variety of other dataline communication technologies that would be apparent to one of skill in the art in possession of the present disclosure.

As such, at block 502a, the powerline networking engine 306b in the power system 306 included in the server device 204a/300 may operate to receive the dataline management communications from the management engine 308a and, in response, convert those dataline management communications to powerline management communications. As will be appreciated by one of skill in the art in possession of the present disclosure, the powerline networking engine 306b may configure the management communications generated by the management engine 308a for simultaneous transmission along with AC power via conductor(s) in power cabling that is connected to the power connector 306d in the power system 306 included in the server device 204a/300. As such, the powerline networking engine 306b may be configured to perform any of a variety of dataline/powerline communication conversion operations that one of skill in the art in possession of the present disclosure would recognize as providing for the transformation of any of a variety of dataline protocol communication data to powerline protocol communication data at block 502a. In a specific example, the powerline networking engine 306b may operate similarly as and/or according to the "Homeplug" standard promulgated by the HomePlug Power Alliance, which one of skill in the art in possession of the present disclosure will recognize defines conversion and transmission protocols for powerline networking operations, and includes transmitting powerline management signals and/or other data at a different frequency than the power transmissions (e.g., AC power signals).

Figure 6D:
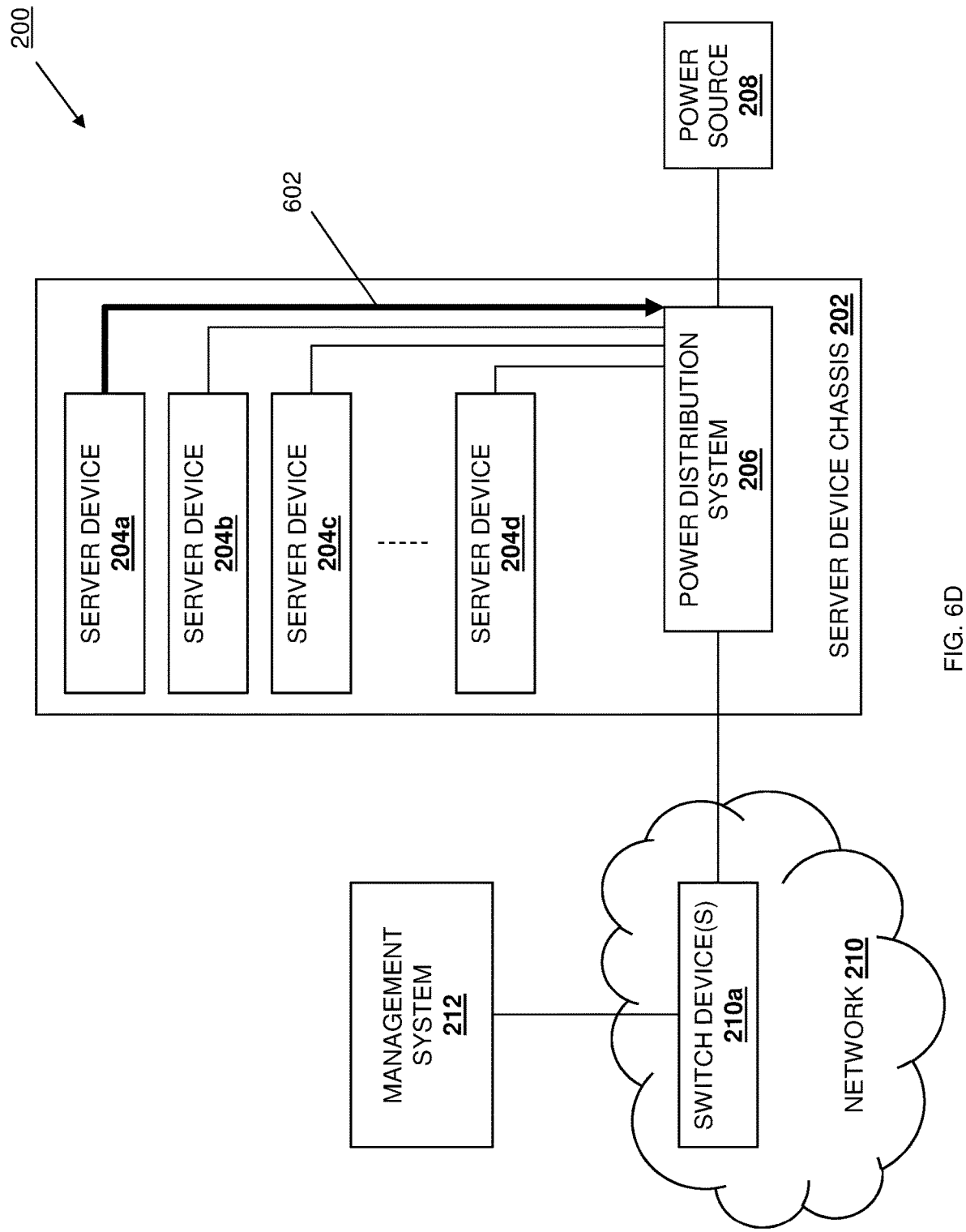
FIG. 6D is a schematic view illustrating an embodiment of the power distribution powerline networking management system of FIG. 2 operating during the method of FIG. 5.
Figure 6E:
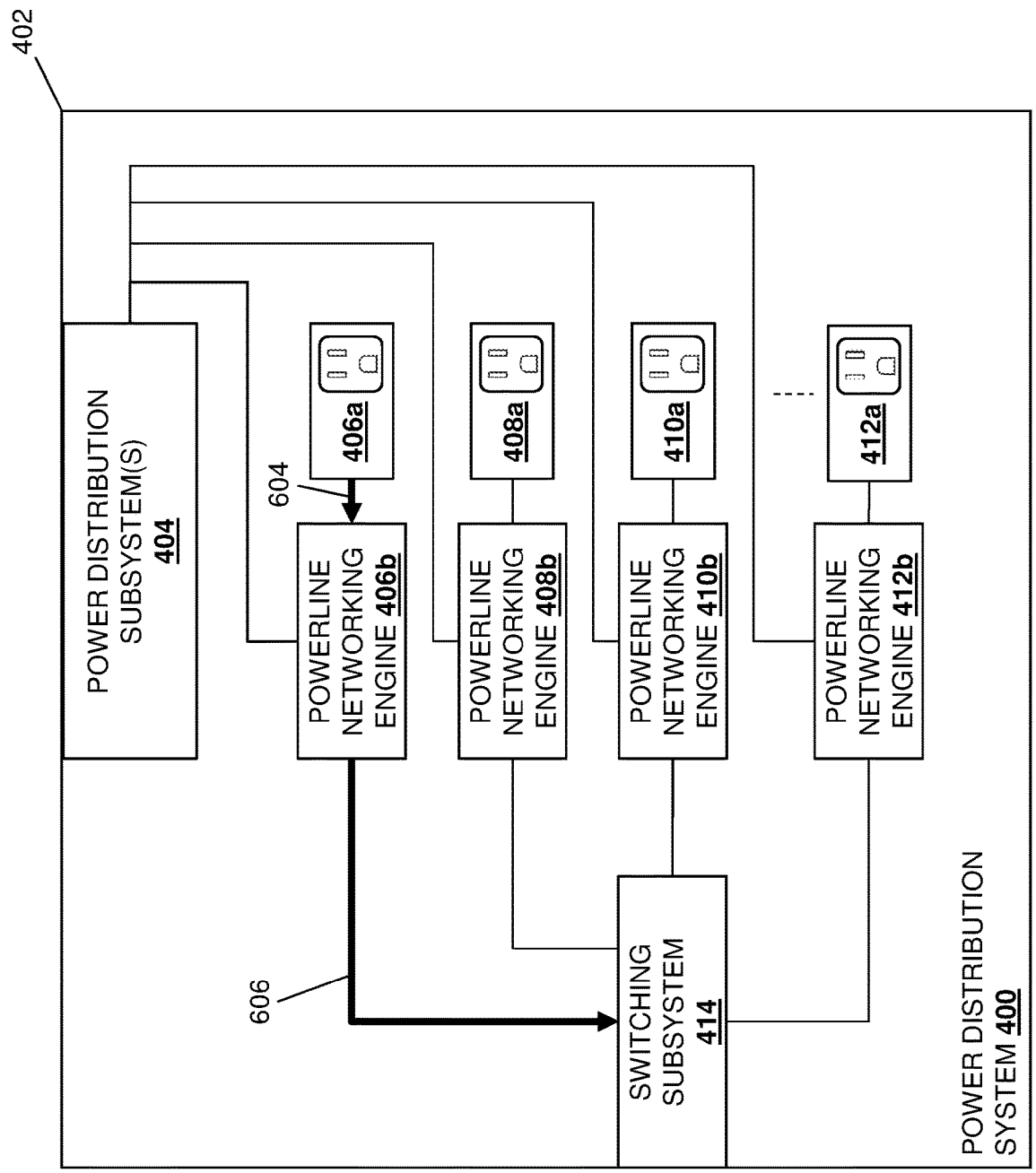
FIG. 6E is a schematic view illustrating an embodiment of the power distribution system of FIG. 4 operating during the method of FIG. 5.

With reference to FIGS. 6A and 6C, at block 502a and subsequent to converting the dataline management communications to powerline management communications, the powerline networking engine 306b may perform powerline management communication transmission operations 602 in order to transmit the powerline management communications out of the power system 306 via the power connector 306d. With reference to FIGS. 6C, 6D, and 6E, the powerline management communication transmission operations 602 that operate to transmit the powerline management communications out of the power system 306 in the server device 204a/300 via its power connector 306d also operate to transmit the powerline management communications from the server device 204*a* to the power distribution system 206 via the power cabling that extends between the power connector 306*d* on the power system 306 in the server device 204*a*/300 (e.g., via an AC power cable that is connected to the power connector 306*d* on the power system 306) and the power connector 406*a* on the power distribution system 206/400. Thus, at block 502*a*, the powerline management communications are received by the power distribution system 206/400 at the power connector 406*a*, and one of skill in the art in possession of the present disclosure will recognize that power management communications may be received at the power connectors 408*a*, 410*a*, and up to 412*a* in a similar manner from any of the server devices 204*b*-204*d* via the power cabling that connects those server devices to those power connectors.

The method 500 may then proceed to block 502*b* where power distribution powerline networking engine(s) coupled to the power connector(s) in the power distribution system convert the powerline management communication(s) to dataline management communication(s). With reference to FIG. 6E, in an embodiment of block 502*b*, the power connector 406*a* in the power distribution system 206/400 may perform powerline management communication transmission operations 604 that operate to provide the powerline management communications received at block 502*a* to the powerline networking engine 406*a*, and one of skill in the art in possession of the present disclosure will appreciate how any of the power connectors 408*a*, 410*a*, and up to 412*a* may provide powerline management communications to their respective powerline networking engines 408*b*, 410*b*, and up to 412*b* in a similar manner while remaining within the scope of the present disclosure as well. As such, at block 502*b*, the powerline networking engine 406*b* in the power distribution system 206/400 may operate to receive the powerline management communications from the power connector 406*a* and, in response, convert those powerline management communications to dataline management communications.

As will be appreciated by one of skill in the art in possession of the present disclosure, the conversion operations performed at block 502*b* may convert the powerline management communications received during the transmission of AC power (e.g., via conductor(s) in power cabling that is connected to the power distribution system 206/400) to dataline management communication that are configured to be transmitted on network cabling (e.g., Ethernet cabling, Fiber Optic cabling, etc.). As such, the powerline networking engine 406*b* may be configured to perform any of a variety of dataline/powerline communication conversion operations that one of skill in the art in possession of the present disclosure would recognize as providing for the transformation of any of a variety of powerline protocol communication data to dataline protocol communication data at block 502*b*.

The method 500 may then proceed to block 502*c* where the power distribution powerline networking engine(s) transmit the dataline management communication(s) to a switching subsystem in the power distribution system. With reference to FIG. 6E, in an embodiment of block 502*c*, the powerline networking engine 406*b* in the power distribution system 206/400 may perform dataline management communication transmission operations 606 that operate to transmit the dataline management communications to the switching subsystem 414 in the power distribution system 206/400, and one of skill in the art in possession of the present disclosure will recognize how any of the powerline networking engines 408*b*, 410*b*, and 412*b* in the power distribution system 206/400 may perform similar dataline management communication transmission operations to transmit dataline management communications to the switching subsystem 414 in the power distribution system 206/400 in a similar manner while remaining within the scope of the present disclosure as well. As such, at block 502*c*, the switching subsystem 414 may receive the dataline management communications that were converted by the powerline networking engine 406*b*.

Figure 6F:
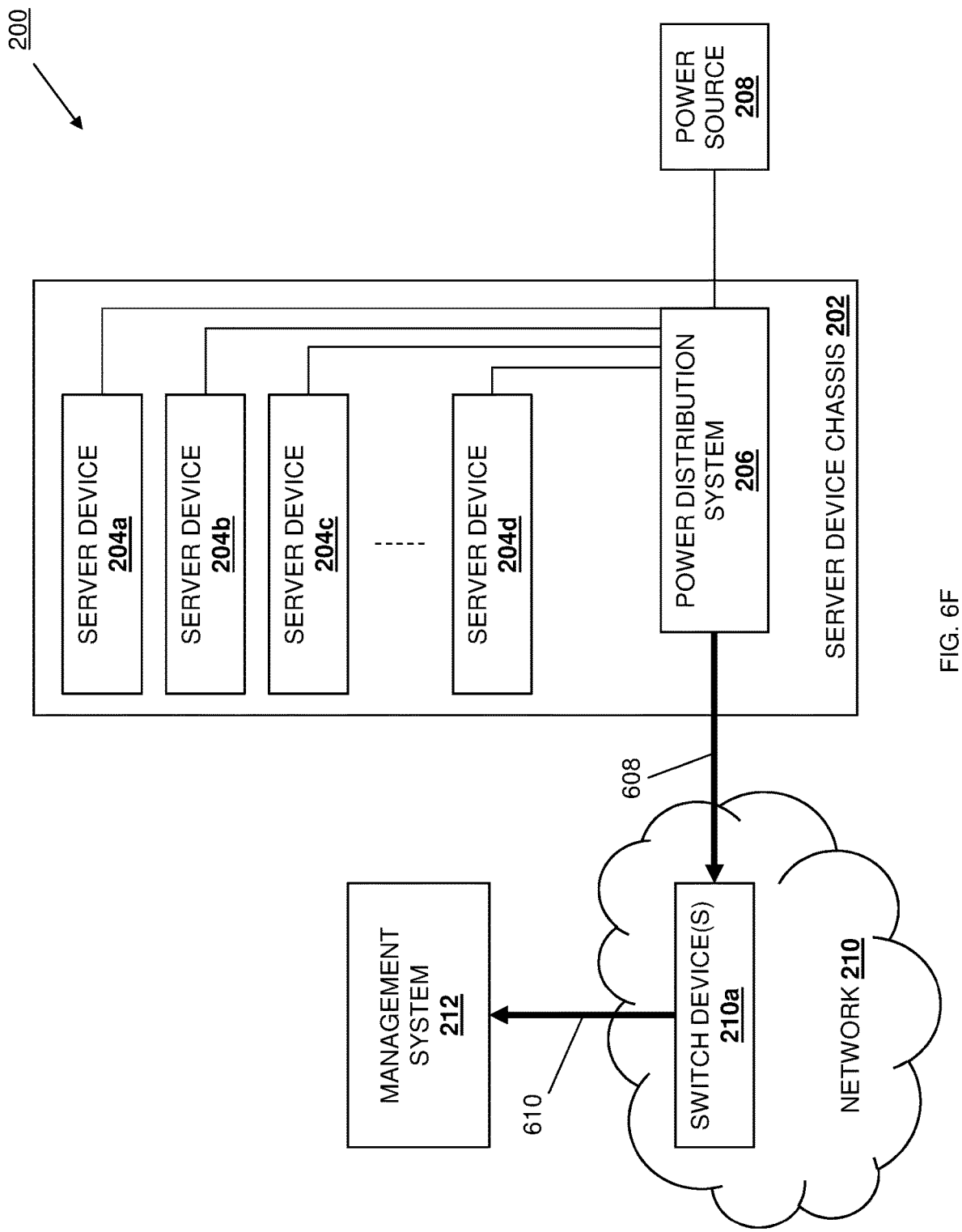
FIG. 6F is a schematic view illustrating an embodiment of the power distribution powerline networking management system of FIG. 2 operating during the method of FIG. 5.

The method 500 may then proceed to block 502*d* where the switching subsystem in the power distribution system transmits the dataline management communication(s) via a network. With reference to FIG. 6F, in an embodiment of block 502*d*, the switching subsystem 414 in the power distribution system 206/400 may operate to perform dataline management communication transmission operations 608 that operate to transmit the dataline management communications converted at block 502*c* via the network 210 to the management system 212, which may include those dataline management communications being received by one or more switch devices 210*a* that provide the network 210, and those one or more switch devices 210*a* performing dataline management communication transmission operations 610 to transmit the dataline management communications to the management system 212. As such, one of skill in the art in possession of the present disclosure will appreciate how the dataline management communications converted by the switching subsystem 414 and transmitted via the network 210 to the management system 212 may include a variety of routing information that allow its transmission over the network to the management system 212 while remaining within the scope of the present disclosure. Furthermore, one of skill in the art in possession of the present disclosure will recognize how, in response to receiving the dataline management communications, the management system 212 may perform any of a variety of management operations (e.g., using those dataline management communications, in response to those dataline management communications, etc.) that will fall within the scope of the present disclosure.

Thus, the server device 204*a* (and any of the server devices 204*b*-204*d*) may transmit management communications to the management system 212 via power cabling (e.g., a single AC power cable extending between the power supply system in that server device and the power distribution system 206), eliminating the need for conventional management networking cabling that extends between the server device 204*a* and a management switch device in the server device chassis 202/server rack and that must conventionally be routed through the server device chassis 202/server rack, as well as allowing (in some embodiments) for the elimination of the management switch device from the server device chassis 202/server rack. As will be appreciated by one of skill in the art in possession of the present disclosure, providing for the elimination of such network cabling and management switch devices frees up space in the server device chassis 202/server rack that may reduce the size of the server device chassis 202/server rack and/or be used for other server devices.

As discussed above, that transmission of the management communications from the server devices 204*a*-204*d* to the management system 212 may be performed at the same (or a different) time as the transmission of management communications from the management system 212 to the server devices 204*a*-204*d*. As such, in some embodiments, the method 500 may begin at block 504*a* where the switching subsystem in the power distribution system receives dataline management communication(s) via the network. As will be appreciated by one of skill in the art in possession of the present disclosure, the management system 212 may operate during the method 500 to generate management communications associated with the management of the server device 204a. For example, the management system 212 may be configured to generate and transmit management communications to the iDRACs discussed above that may be included in server devices provided by DELL® Inc. of Round Rock, Texas, United States, which may provide for the management of those server device via a network, and thus any of a variety of management communications known in the art are envisioned as falling within the scope of the present disclosure.

As such, in an embodiment of block 504a, the management system 212 may generate dataline management communications, which as discussed above may include Ethernet management communications, Fiber Channel management communications, iSCSI management communication, and/or management communications transmitted via any of a variety of other dataline communication technologies that would be apparent to one of skill in the art in possession of the present disclosure. The management system 212 may then perform dataline management communication transmission operations 700 that operate to transmit the dataline management communications via the network 210 to the switching subsystem 414 in the power distribution system 206/400, which may include those dataline management communications being received by one or more switch devices 210a that provide the network 210, and those one or more switch devices 210a performing dataline management communication transmission operations 702 to transmit the dataline management communications to the switching subsystem 414 in the power distribution system 206/400. As such, one of skill in the art in possession of the present disclosure will appreciate how the dataline management communications generated by the management system 212 may include a variety of routing information that allow its transmission over the network 210 to the switching subsystem 414 in the power distribution system 206/400 while remaining within the scope of the present disclosure. Thus, at block 504a, the switching subsystem 414 in the power distribution system 206/400 may receive the dataline management communications from the management system 212 via the network 210.

Figure 7A:
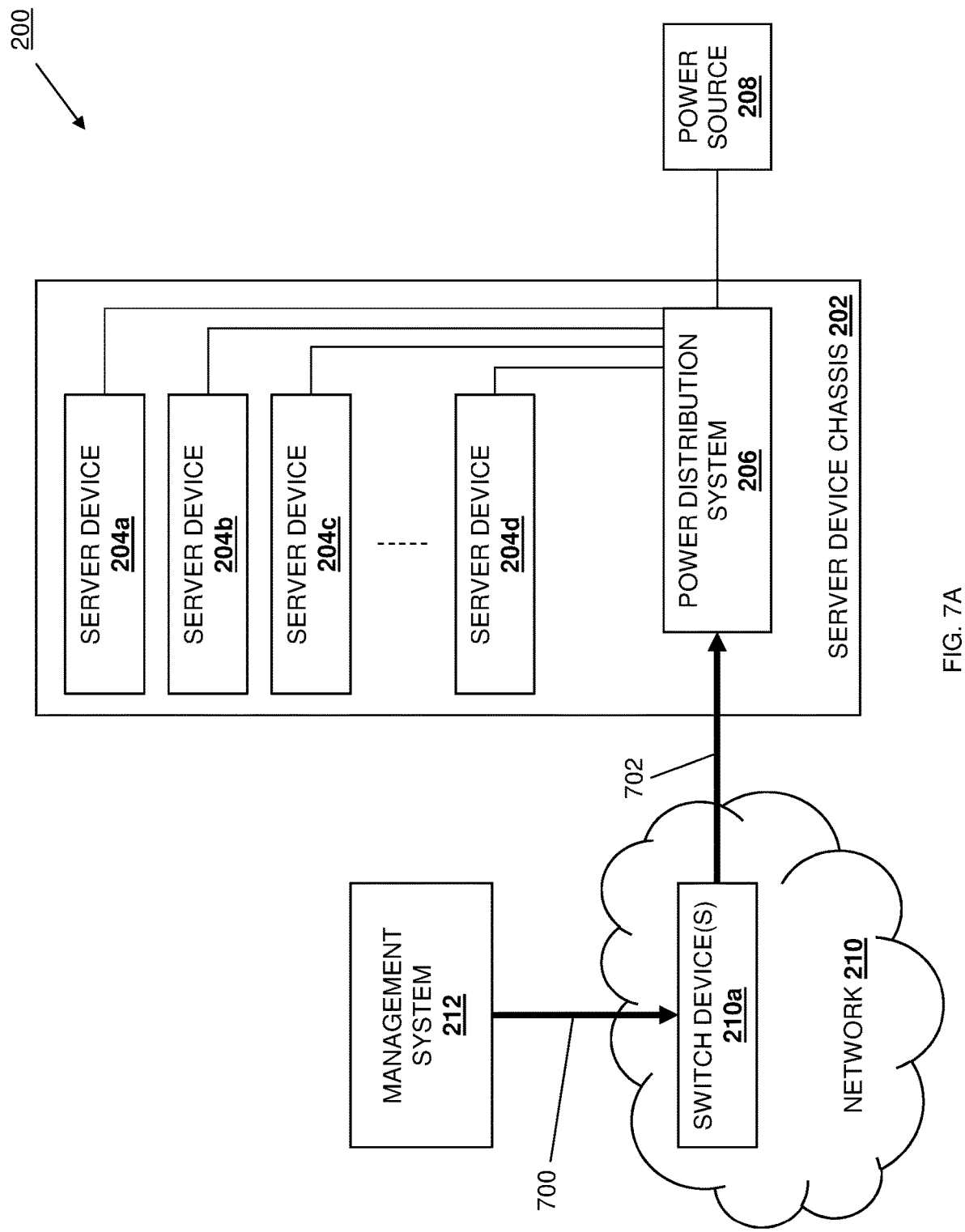
FIG. 7A is a schematic view illustrating an embodiment of the power distribution powerline networking management system of FIG. 2 operating during the method of FIG. 5.
Figure 7B:
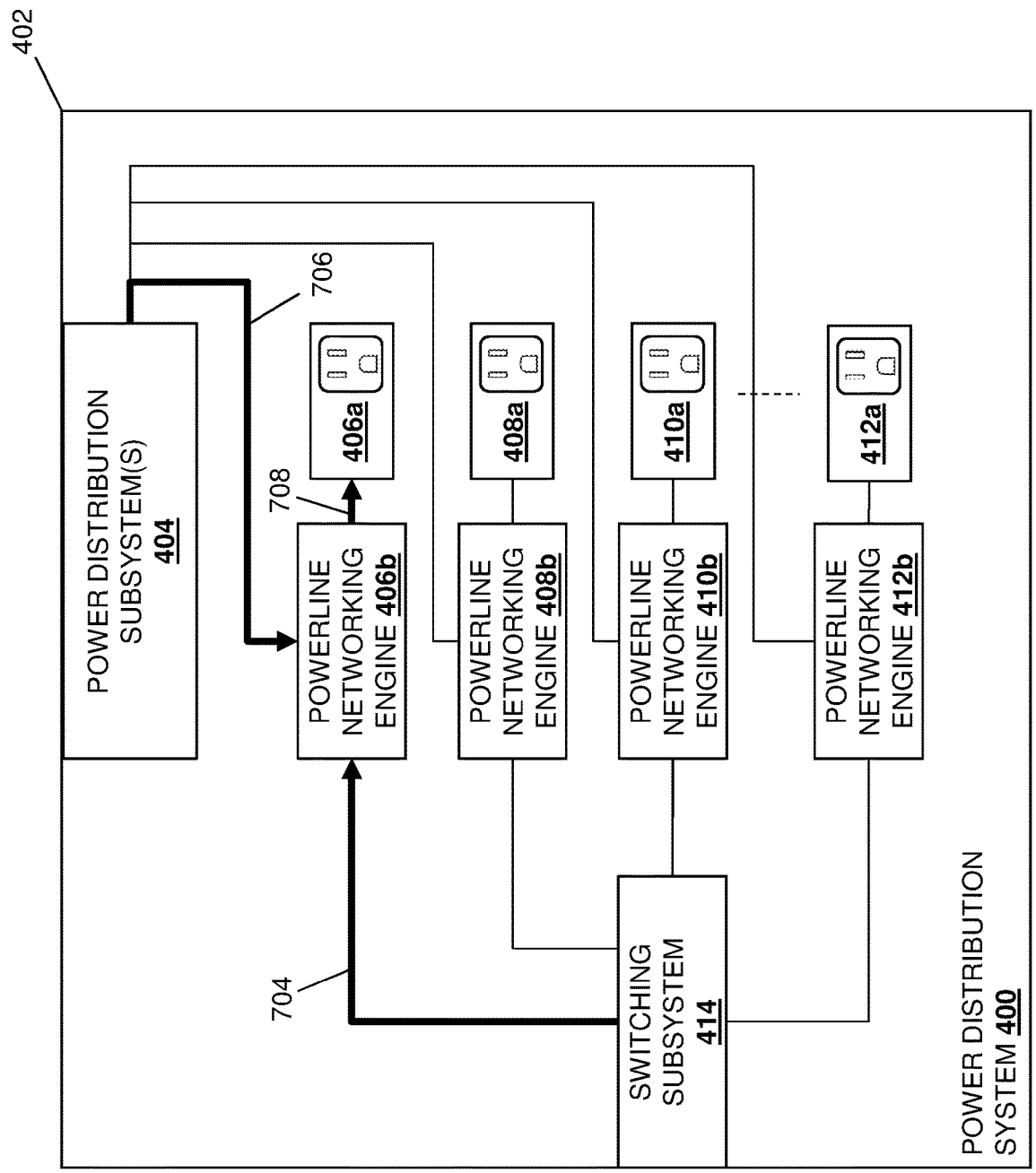
FIG. 7B is a schematic view illustrating an embodiment of the power distribution system of FIG. 4 operating during the method of FIG. 5.

The method 500 may then proceed to block 504b where the switching subsystem in the power distribution system transmits the dataline management communication(s) to the power distribution powerline networking engine(s) in the power distribution system. With reference to FIG. 7B, in an embodiment of block 504b, the switching subsystem 414 in the power distribution system 206/400 may then perform dataline management communication transmission operations 704 that operate to transmit the dataline management communications received via the network 210 to the powerline networking engine 406b in the power distribution system 206/400. As discussed above, the dataline management communications received via the network 210 may include a variety of routing information that allow the switching subsystem 414 to identify the management subsystem 308 in the server device 204a/300 as the destination of those dataline management communication, and thus may operate to transmit those dataline management communications to the powerline networking engine 406b that is provided with the power connector 406a that is identified as being connected to that server device 204a via power cabling. Furthermore, one of skill in the art in possession of the present disclosure will appreciate how dataline communications destined for any of the server devices 204b-204d may be transmitted to the powerline networking engine provided with the power connector connected to those server devices in a similar manner as well. As such, at block 504b, the power networking engine 406b may receive the dataline management communications.

The method 500 may then proceed to block 504c where power distribution powerline networking engine(s) convert the dataline management communication(s) to powerline management communication(s). With reference to FIG. 7B, in an embodiment of block 504c, the powerline networking engine 406b in the power distribution system 206/400 may operate to receive the dataline management communications from the switching subsystem 414 and, in response, convert those dataline management communications to powerline management communications. As will be appreciated by one of skill in the art in possession of the present disclosure, the conversion operations performed at block 504c may convert the dataline management communications received from the switching subsystem 414 to powerline management communications that may then be transmitted, along with AC power 706 received via the power distribution subsystem(s) 404 from the power source 208, via conductor(s) in power cabling that is connected to the power connector 406a on the power distribution system 206/400. As such, the powerline networking engine 406b may be configured to perform any of a variety of dataline/powerline communication conversion operations that one of skill in the art in possession of the present disclosure would recognize as providing for the transformation of any of a variety of dataline protocol communication data to powerline protocol communication data at block 504c.

The method 500 may then proceed to block 504d where power distribution powerline networking engine(s) transmit the powerline management communication(s) via the power connector(s) in the power distribution system. With continued reference to FIG. 7B, in an embodiment of block 504d, the powerline networking engine 406b in the power distribution system 206/400 may perform powerline management communication transmission operations 708 in order to transmit the powerline management communications converted at block 504c along with the AC power 706 to the power connector 406c, and one of skill in the art in possession of the present disclosure will recognize how any of the powerline networking engines 408b, 410b, and up to 412b may operate to convert dataline management communications to powerline management communications, receive AC power, and transmits the powerline management communications along with AC power via their respective power connectors 408a, 410a, and up to 412a while remaining within the scope of the present disclosure as well.

Figure 7C:
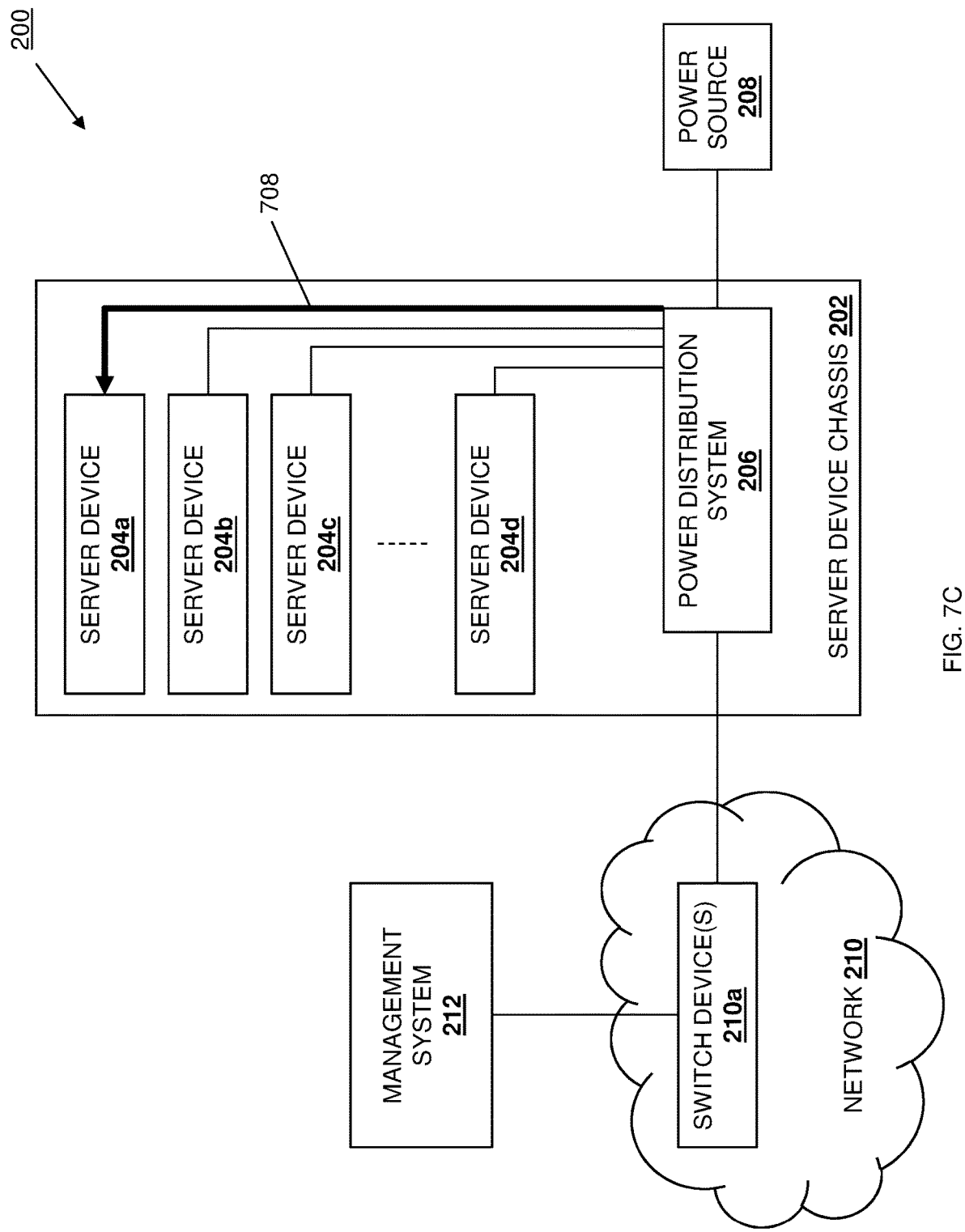
FIG. 7C is a schematic view illustrating an embodiment of the power distribution powerline networking management system of FIG. 2 operating during the method of FIG. 5.

With reference to FIG. 7C, at block 504d, the powerline management communication transmission operations 708 that transmit the powerline management communications along with AC power 706 out of the power connector 406a in the power distribution system 206/300 also operate to transmit the powerline management communications along with AC power 706 to the server device 204a via the power cabling that extends between the power connector 406a on the power distribution system 206/400 (e.g., an AC power cable that is connected to the power connector 406a), and the power connector 306d on the power system 306 in the server device 204a/300. Thus, at block 504d, the powerline management communications are received by the power system 306 in the server device 204a/300.

Figure 7D:
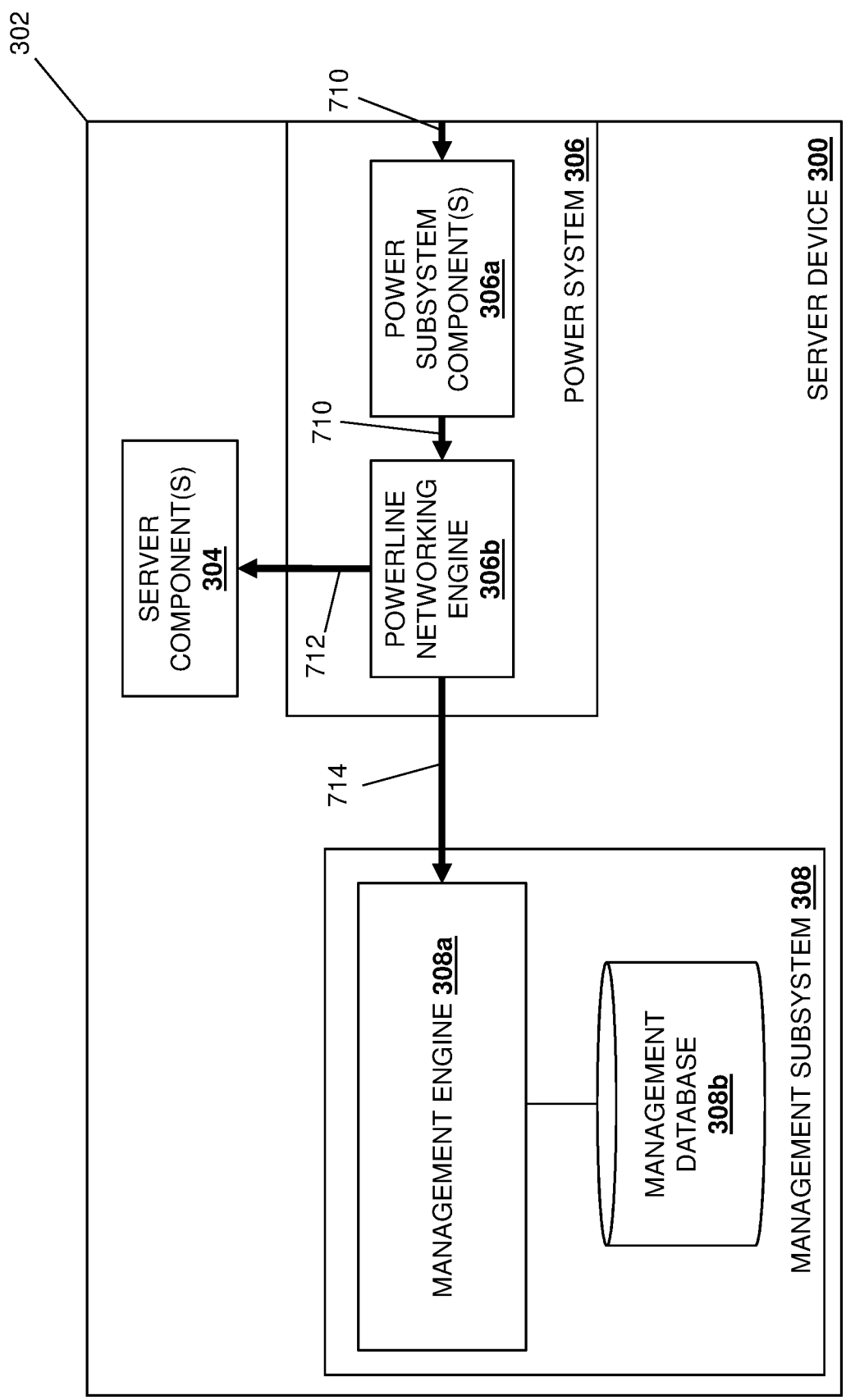
FIG. 7D is a schematic view illustrating an embodiment of the server device of FIG. 3A operating during the method of FIG. 5.
Figure 7E:
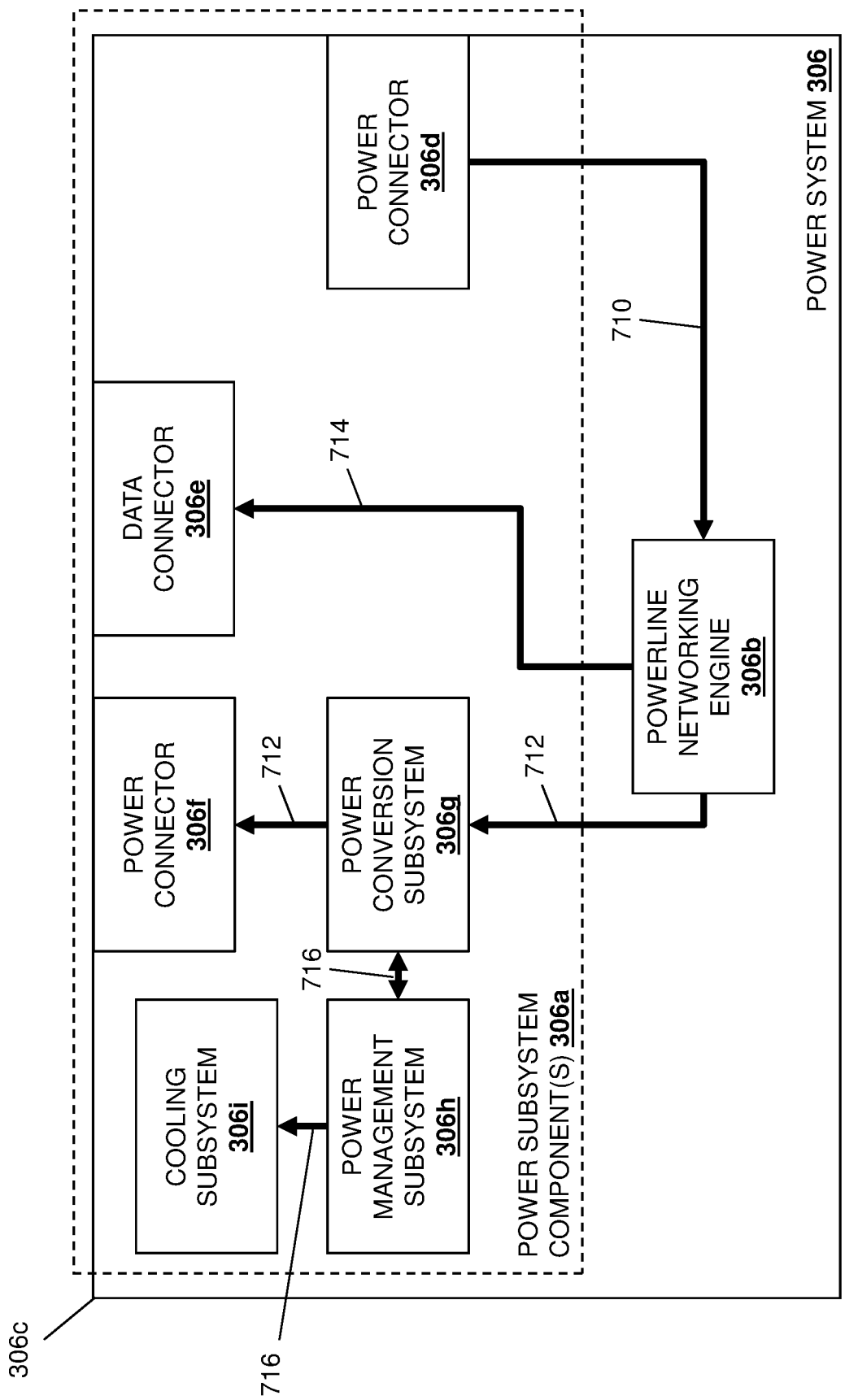
FIG. 7E is a schematic view illustrating an embodiment of the power system of FIG. 3C operating during the method of FIG. 5.

As illustrated in FIGS. 7D and 7E, in an embodiment of block 504d, the power system 306 in the server device 204a/300 may perform powerline management communications transmission operations 710 that operate to transmit the powerline management communications received by the power system 306 at the power connector 306d to the power networking engine 306b in the power system 306 included in the server device 204a/300. As such, in an embodiment, the powerline networking engine 306b may receive the powerline management communications and AC power and, in response, may operate to convert those powerline management communications to dataline management communications. As will be appreciated by one of skill in the art in possession of the present disclosure, the conversion operations performed at block 504d may convert the powerline management communications (received along with the AC power via conductor(s) in power cabling that is connected to the power system 306 in the server device 204a/300) to dataline management communication that are configured to be transmitted on network cabling (e.g., Ethernet cabling, Fiber Optical cabling, etc.). As such, the powerline networking engine 306b may be configured to perform any of a variety of dataline/powerline communication conversion operations that one of skill in the art in possession of the present disclosure would recognize as providing for the transformation of any of a variety of powerline protocol communication data to dataline protocol communication data at block 504d.

Figure 7F:
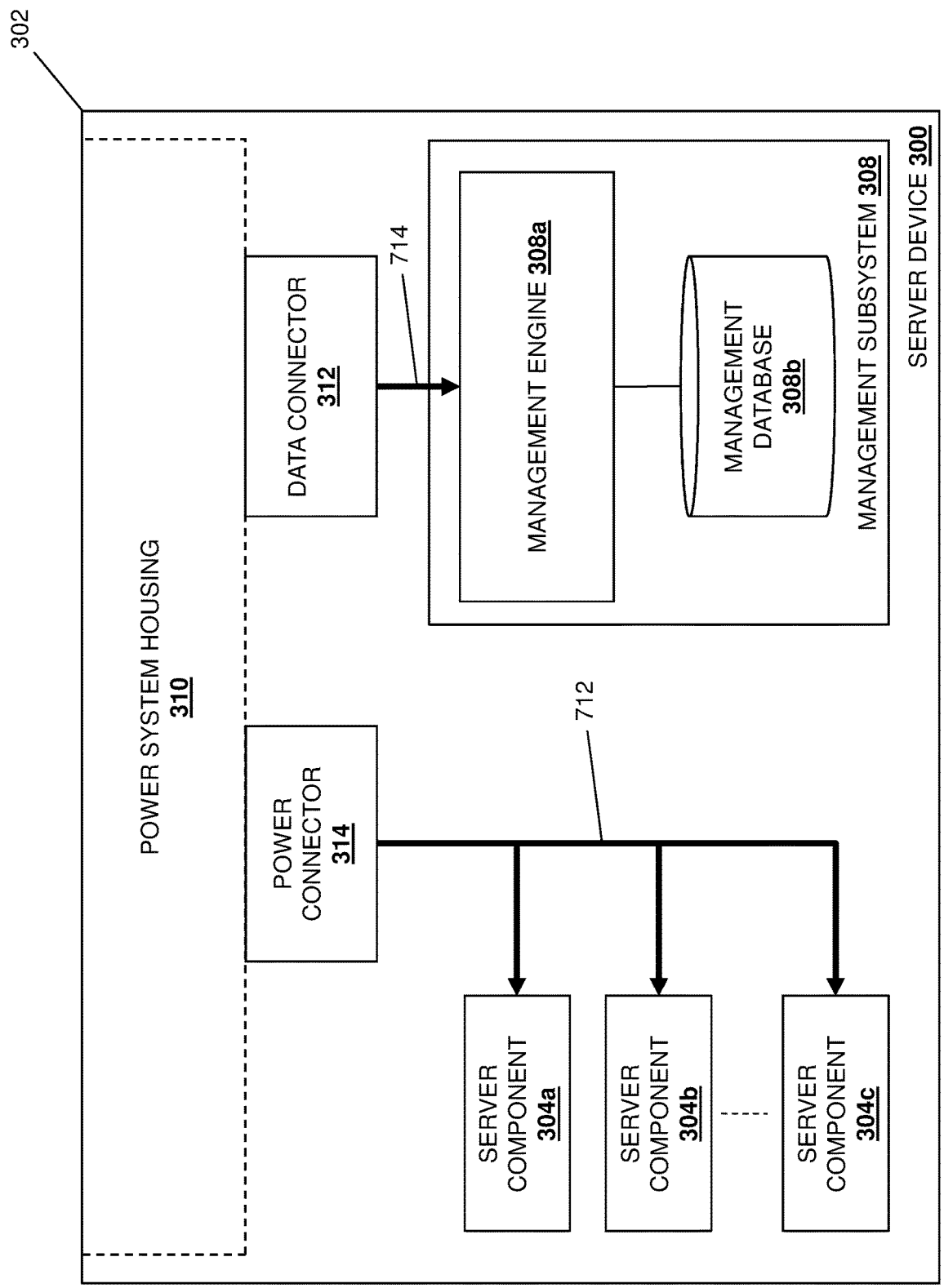
FIG. 7F is a schematic view illustrating an embodiment of the server device of FIG. 3B operating during the method of FIG. 5.

As illustrated in FIGS. 7D, 7E, and 7F, in an embodiment of block 504d, the powerline networking engine 306b in the power system 306 included in the server device 204a/300 may then operate to perform power transmission operations 712 to transmit the power (e.g., AC power) that was received along with the powerline management communications via the power conversion subsystem 306g and through the power connectors 306f and 314 to the server components 304a, 304b, and up to 304c for utilization in their operations. As will be appreciated by one of skill in the art in possession of the present disclosure, the power conversion subsystem 306g may perform a variety of power conversion operations known in the art on the power received from the powerline networking engine 306d (e.g., converting AC power to DC power in this example) in order to generate converted power, and then distribute or otherwise route that converted power to the server components 304a, 304b, and up to 304c via the power couplings 314a.

In addition, the powerline networking engine 306b may also perform dataline management communication transmission operations 714 to transmit the dataline management communications (which were converted from the powerline management communications) via the data connectors 306e and 312 and through the data couplings 312a to the management engine 308a in the management subsystem 308. Thus, at block 504d, the management engine 308a may receive the dataline management communications, and one of skill in the art in possession of the present disclosure will recognize how the management engine 308a may then perform any of a variety of management operations (e.g., using those dataline management communications, in response to those dataline management communications, etc.) that will fall within the scope of the present disclosure.

In some embodiments, the power management subsystem 306h may perform a variety of power management and/or monitoring operations known in the art during the operations of the power system 306. For example, as illustrated in FIG. 7E, the power management subsystem 306h may perform power monitoring communication operations 716 with the power conversion subsystem 306g in order to monitor power consumed by the server device 300 via the power system 306 (e.g., watts consumed) and, in some embodiments, report that monitored power consumed to a user. In addition, the power management and/or monitoring operations performed by the power management subsystem 306h may include monitoring a temperature of the power system 306 and, in some situations, performing power system cooling operations 716 that may include controlling the cooling subsystem 306i based on that temperature by, for example, activating one or more fan devices to cool the power system 306 when the temperature exceeds a temperature threshold. However, while specific management/monitoring operations have been described, one of skill in the art in possession of the present disclosure will appreciate that the power management subsystem 306h may perform a variety of other management operations (PSU management operations) known in the art while remaining within the scope of the present disclosure.

Thus, systems and methods have been described that provide a PSU that includes a powerline networking engine that operates to convert between dataline management communications and powerline management communications, which allows the BMC in a server device that includes that PSU to perform management operations via the power cabling connected to the PSU. For example, embodiments of the PSU powerline networking management system of the present disclosure may include a server chassis housing a PSU coupled to a plurality of server components and a BMC. A powerline networking engine in the PSU receives first powerline management communications along with power via its first power connector, and converts the first powerline management communications to first dataline management communications. The powerline networking engine then transmits the first dataline management communications to the BMC via its data connector, and provides the power to the plurality of server components via its second power connector. The data connector and the second power connector may be provided by a single, integrated connector structure, or by separate connector structures. The PSU may also be configured to convert power, monitor and report the provisioning of power to the plurality of server components, and activate a cooling system if the PSU exceeds a temperature threshold. As such, management communications associated with BMCs in server devices may be converted by the PSU between dataline management communications and powerline management communications in order to allow their transmission via power cabling, thus eliminating the need for management network cabling for each of the server devices in order to enable the performance of management operations.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A power supply powerline networking management system, comprising:
   a chassis:
   a plurality of components that are included in the chassis;
   a data network communication system that is included in the chassis and that is coupled to at least one of the plurality of components, wherein the data network communication system is coupled to a data network via data network cabling and at least one data switch device, and wherein the plurality of components are configured to:
send and receive data communications via the data network using the data network communication system;
a management subsystem that is included in the chassis;
a power system that is included in the chassis, that is coupled to the plurality of components and the management subsystem, and that provides a management network communication system that is coupled via power cabling and at least one management switch device to a management network that is separate from the data network; and
a powerline networking engine that is included in the power system and that is configured to:
receive, via a first power connector on the power system that is coupled to the management network via the power cabling, power along with first powerline management communications that are configured to cause the management subsystem to monitor one or more of the plurality of components and perform at least one management operation based on that monitoring;
convert the first powerline management communications to first dataline management communications that were previously transmitted via the management network and converted to the first powerline management communications;
transmit, to the management subsystem via a data connector on the power system, the first dataline management communications to cause the management subsystem to monitor the one or more of the plurality of components and perform the at least one management operation based on that monitoring; and
provide, to the plurality of components via a second power connector on the power system, the power.

2. The system of claim 1, wherein each of the data connector and the second power connector are included on single, integrated connector structure.

3. The system of claim 1, wherein the data connector is provided by a first connector structure and the second power connector is provided by a second connector structure that is different than the first connector structure.

4. The system of claim 1, wherein the powerline networking engine is configured to:
receive, from the management subsystem via the data connector, second dataline management communications that were provided by the management subsystem for transmission via the management network;
convert the second dataline management communications to second powerline management communications; and
transmit, via the first power connector, the second powerline management communications.

5. The system of claim 1, wherein the power system includes:
a power conversion subsystem that is configured to:
convert the power to provide converted power; and
provide the converted power to the plurality of server components.

6. The system of claim 1, wherein the power system includes:
a power management subsystem that is configured to:
monitor the power consumed by one or more of the plurality of components; and
perform the at least one management operation that includes reporting the power consumed by the one or more of the plurality of components.

7. The system of claim 1, wherein the power system includes:
a cooling subsystem; and
a power management subsystem that is coupled to the cooling subsystem and configured to:
monitor a temperature of the power system; and
perform the at least one management operation that includes activating, in response to the temperature of the power system exceeding a threshold, the cooling subsystem.

8. An Information Handling System (IHS), comprising:
an Information Handling System (IHS) chassis;
a data network communication system that is included in the IHS chassis and that is coupled to at least one IHS component, wherein the data network communication system is coupled to a data network via data network cabling and at least one data switch device, and wherein the at least one IHS component is configured to:
send and receive data communications via the data network using the data network communication system;
a power supply system chassis that is included in the IHS chassis;
a data connector that is included on the power supply system chassis;
a first power connector that is included on the power supply system chassis;
a second power connector that is included on the power supply system chassis;
a processing system that is housed in the power supply system chassis and coupled to the data connector, the first power connector, and the second power connector;
a memory system that is housed in the power supply system chassis, that is coupled to the processing system, and that includes instructions that, when executed by the processing system, cause the processing system to provide a powerline networking engine that provides a management network communication system that is coupled via power cabling and at least one management switch device to a management network that is separate from the data network, wherein the powerline networking engine that is configured to:
receive, via the first power connector that is coupled to the management network via the power cabling, power along with first powerline management communications that are configured to cause a management subsystem to monitor the at least one IHS component and perform at least one management operation based on that monitoring;
convert the first powerline management communications to first dataline management communications that were previously transmitted via the management network and converted to the first powerline management communications;
transmit, to the management subsystem via the data connector, the first dataline management communications to cause the management subsystem to monitor the at least one IHS component and perform the at least one management operation based on that monitoring; and
provide, to a plurality of components via the second power connector, the power.

9. The power supply system of claim 8, wherein each of the data connector and the second power connector are included on single, integrated connector structure.

10. The power supply system of claim 8, wherein the data connector is provided by a first connector structure and the second power connector is provided by a second connector structure that is different than the first connector structure.

11. The power supply system of claim 8, wherein the powerline networking engine is configured to:
receive, from the management subsystem via the data connector, second dataline management communications that were provided by the management subsystem for transmission via the management network;
convert the second dataline management communications to second powerline management communications; and
transmit, via the first power connector, the second powerline management communications.

12. The power supply system of claim 8, further comprising:
a power conversion subsystem that is configured to:
convert the power to provide converted power; and
provide the converted power to the plurality of server components.

13. The power supply system of claim 8, further comprising:
a cooling subsystem; and
a power management subsystem that is coupled to the cooling subsystem and configured to:
monitor a temperature of the power system; and
perform the at least one management operation that includes activating, in response to the temperature of the power system exceeding a threshold, the cooling subsystem.

14. A method for power supply powerline networking management, comprising:
sending and receiving, by at least one component in a computing device via a data network communication system in the computing device that is coupled to the at least one component and to a data network via data network cabling and at least one data switch device, data communications;
receiving, by a power system in the computing device via a first power connector that is coupled to a management network via the power cabling, power along with first powerline management communications that are configured to cause a management subsystem to monitor the at least one component and perform at least one management operation based on that monitoring, wherein the power system provides a management network communication system that is coupled via power cabling and at least one management switch device to the management network that is separate from the data network;
converting, by the power system in the computing device, the first powerline management communications to first dataline management communications that were previously transmitted via the management network and converted to the first powerline management communications;
transmitting, by the power system to the management subsystem via a data connector, the first dataline management communications to cause the management subsystem to monitor the at least one component and perform the at least one management operation based on that monitoring; and
providing, by the power system to a plurality of components via a second power connector, the power.

15. The method of claim 14, wherein each of the data connector and the second power connector are included on single, integrated connector structure.

16. The method of claim 14, wherein the data connector is provided by a first connector structure and the second power connector is provided by a second connector structure that is different than the first connector structure.

17. The method of claim 14, further comprising:
receiving, by the power system from the management subsystem via the data connector, second dataline management communications that were provided by the management subsystem for transmission via the management network;
converting, by the power system, the second dataline management communications to second powerline management communications; and
transmitting, by the power system via the first power connector, the second powerline management communications.

18. The method of claim 14, further comprising:
converting, by the power system, the power to provide converted power; and
providing, by the power system, the converted power to the plurality of server components.

19. The method of claim 14, further comprising:
monitoring, by the power system, the power consumed by the at least one component; and
performing the at least one management operation that includes reporting the power consumed by the at least one component.

20. The method of claim 14, further comprising:
monitoring, by the power system, a temperature of the power system; and
performing, by the power system, the at least one management operation that includes activating, by the power system in response to the temperature of the power system exceeding a threshold, a cooling subsystem.

* * * * *